(12) United States Patent
Hsu et al.

(10) Patent No.: US 11,127,752 B2
(45) Date of Patent: Sep. 21, 2021

(54) STRUCTURE OF SEMICONDUCTOR DEVICE AND METHOD FOR FABRICATING THE SAME

(71) Applicant: United Microelectronics Corp., Hsinchu (TW)

(72) Inventors: Chia-Ching Hsu, Yunlin County (TW); Wang Xiang, Singapore (SG); Shen-De Wang, Hsinchu County (TW); Chun-Sung Huang, Changhua County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/798,126

(22) Filed: Feb. 21, 2020

(65) Prior Publication Data

US 2021/0265376 A1 Aug. 26, 2021

(51) Int. Cl.
*H01L 21/00* (2006.01)
*H01L 27/11573* (2017.01)
*H01L 27/11568* (2017.01)
*H01L 29/423* (2006.01)
*H01L 29/40* (2006.01)
*H01L 29/66* (2006.01)
(Continued)

(52) U.S. Cl.
CPC ...... *H01L 27/11573* (2013.01); *H01L 21/765* (2013.01); *H01L 27/11568* (2013.01); *H01L 29/402* (2013.01); *H01L 29/40117* (2019.08); *H01L 29/42344* (2013.01); *H01L 29/42368* (2013.01); *H01L 29/66681* (2013.01); *H01L 29/66833* (2013.01); *H01L 29/7816* (2013.01); *H01L 29/792* (2013.01)

(58) Field of Classification Search
CPC ......... H01L 27/11573; H01L 29/40117; H01L 21/765; H01L 27/11568; H01L 29/402; H01L 29/42344; H01L 29/42368; H01L 29/66681; H01L 29/66833; H01L 29/7816; H01L 29/792
See application file for complete search history.

(56) References Cited

U.S. PATENT DOCUMENTS 9,343,466 B1 * 5/2016 Zhang ............... H01L 21/02164
10,050,050 B2 * 8/2018 Chuang ............. H01L 27/11573
(Continued)

*Primary Examiner* — Richard A Booth
(74) *Attorney, Agent, or Firm* — J.C. Patents

(57) ABSTRACT

A semiconductor device includes a substrate, having cell region and high-voltage region. A memory cell is on the substrate within the cell region. The memory cell includes a memory gate structure and a selection gate structure on the substrate. A first spacer is sandwiched between or respectively on sidewalls of the memory cell structure and the selection gate structure. First high-voltage transistor is on the substrate within the high-voltage region. A first composite gate structure of the first high-voltage transistor includes a first gate structure on the substrate, an insulating layer with a predetermined thickness on the substrate in a ⌐-like structure or an L-like structure at cross-section, and a second gate structure on the insulating layer along the ⌐-like structure or the L-like structure. The selection gate structure and the second gate structure are originated from a same preliminary conductive layer.

21 Claims, 30 Drawing Sheets

(51) Int. Cl.
*H01L 29/792* (2006.01)
*H01L 21/765* (2006.01)
*H01L 21/28* (2006.01)
*H01L 29/78* (2006.01)

(56) References Cited

U.S. PATENT DOCUMENTS

| | | | | |
|---|---|---|---|---|
| 2014/0170843 A1* | 6/2014 | Chen | ............... | H01L 27/11573 |
| | | | | 438/586 |
| 2015/0072489 A1* | 3/2015 | Baker, Jr. | ......... | H01L 27/11546 |
| | | | | 438/267 |
| 2015/0228739 A1* | 8/2015 | Tang | ............... | H01L 29/42324 |
| | | | | 257/319 |
| 2016/0005756 A1* | 1/2016 | Chuang | ............ | H01L 29/42344 |
| | | | | 257/326 |

* cited by examiner

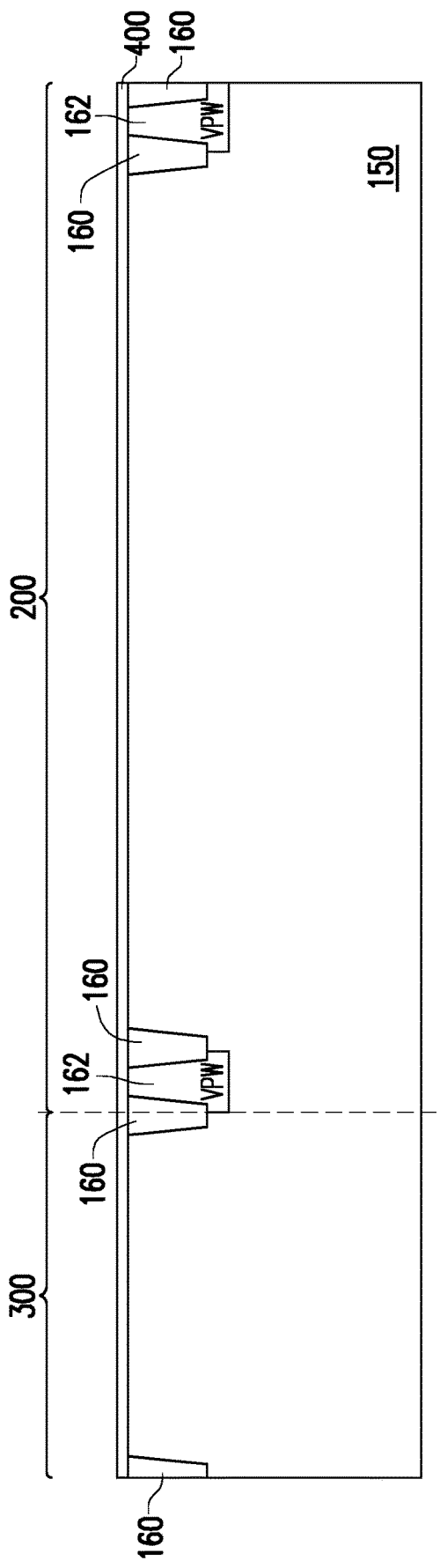
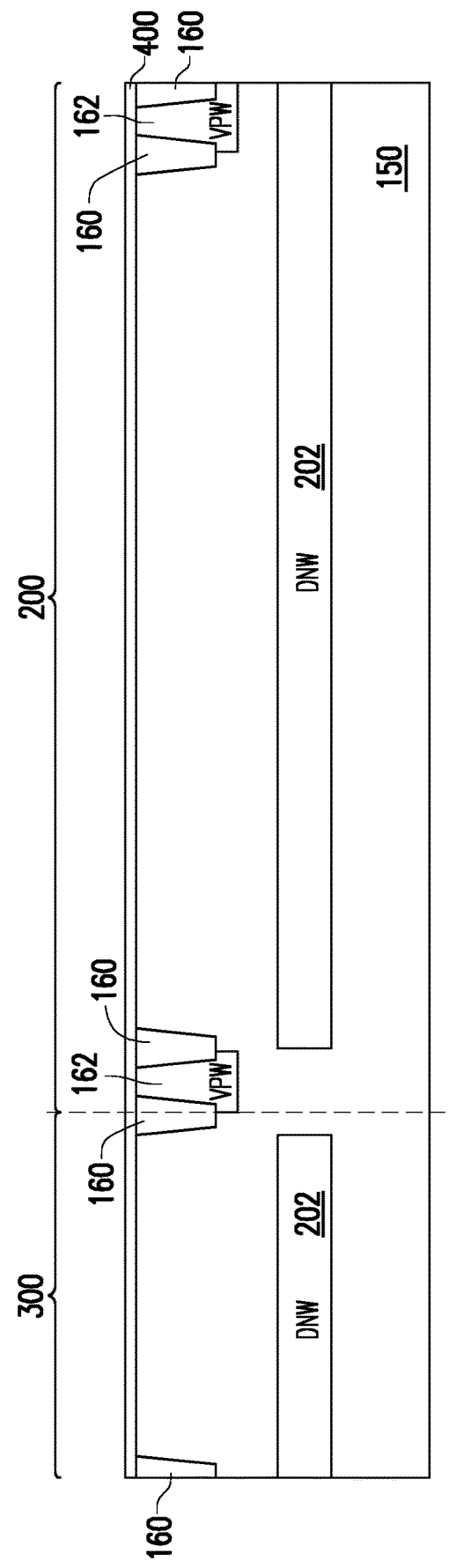

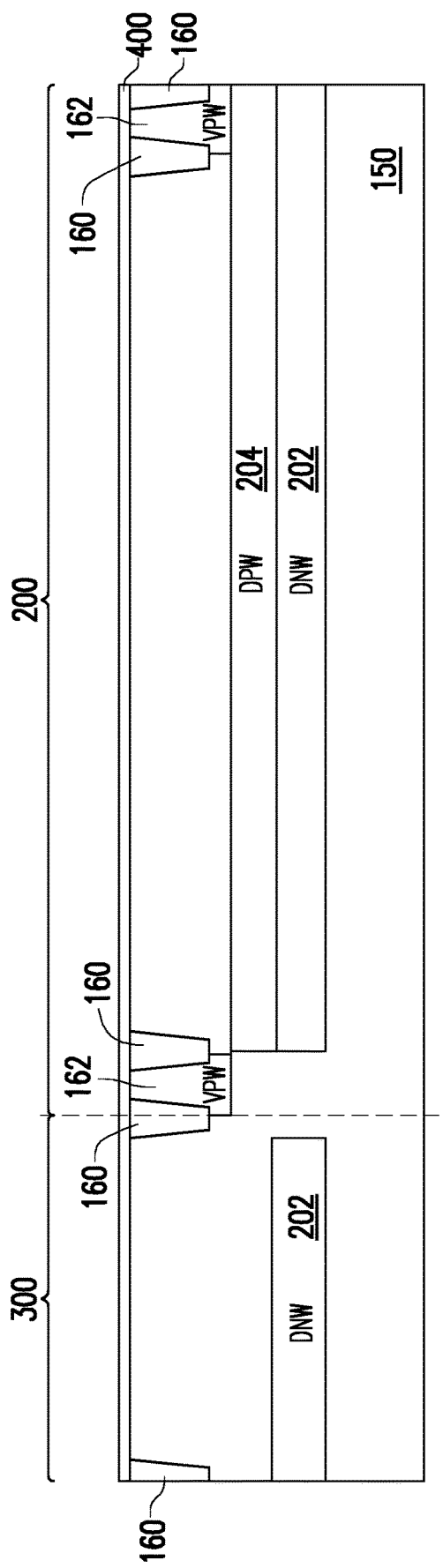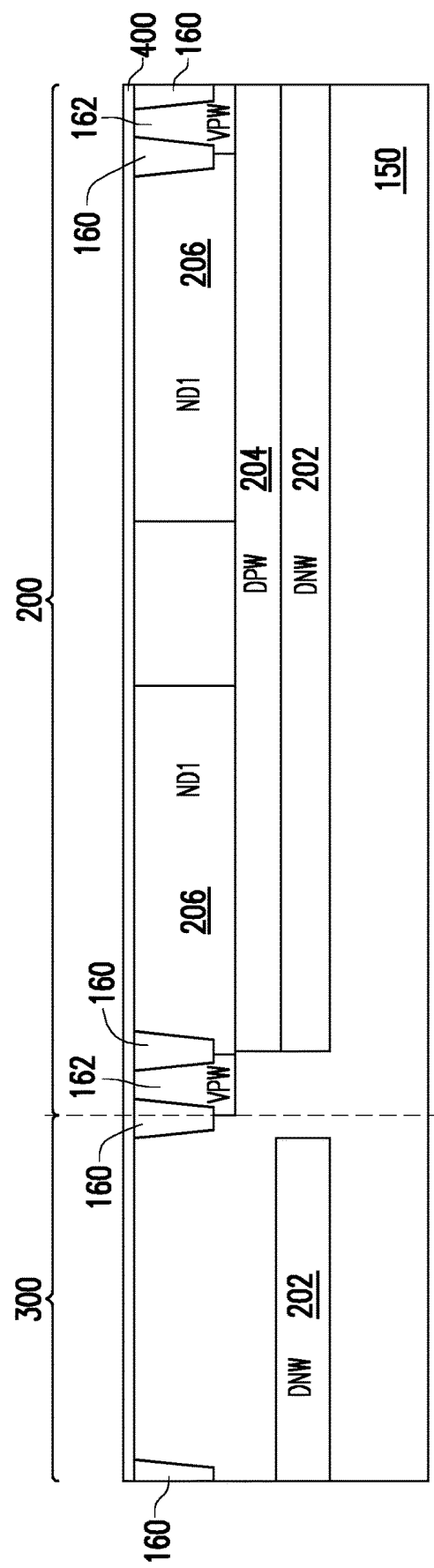
FIG. 9C
FIG. 9D

STRUCTURE OF SEMICONDUCTOR DEVICE AND METHOD FOR FABRICATING THE SAME

BACKGROUND OF THE INVENTION

Field of the Invention

The invention relates to a semiconductor fabrication technology, in particular, to a structure of semiconductor device and method for fabricating the same.

Description of Related Art

An integrated circuit apparatus usually includes various circuits to perform various functions as designed. In an example, a memory apparatus may include memory devices for storing data and the control circuit, that is, core circuit to control the access to the memory devices.

The integrated circuit as fabricated by semiconductor technology usually involves a large amount of field effect transistors in P-type or N-type. As developed in fabrication, the complementary metal oxide semiconductor (CMOS) elements are involved in the integrated circuit. In further development, the double-diffused metal oxide semiconductor (DMOS) elements are also involved in high voltage circuit, such as a power circuit. As development of the integrated circuit with more functions to perform, a Bipolar-CMOS-DMOS (BCD) design is a key technology for the electronic apparatus with power ICs, which may be operated both in low voltage range and high voltage range. The DMOS element involved in the analog circuit is suitable for high voltage circuit in the whole integrated circuit.

However, how to integrate the DMOS elements in the circuit for easy fabrication is still one of the issues in development. The structure of DMOS may have various designs, such as laterally diffused metal-oxide-semiconductor (LDMOS). Further, the LDMOS device may also be referred to LDNMOS for N-type LDMOS or LDPMOS for P-type LDMOS. The conventional DMOS is relatively complicated in fabrication and is not easy to be integrated into the BCD circuit.

How to design the integrated circuit of semiconductor device, such as BCD circuit, for easy fabrication is still in developing.

SUMMARY OF THE INVENTION

The invention provides a semiconductor device and the method for fabricating the semiconductor device. The circuit as integrated with various device structures may be fabricated together with more organized fabrication process for the different device structures.

In an embodiment, the invention provides a structure of semiconductor device. The semiconductor device includes a substrate, configured to have a cell region and a high-voltage region. A memory cell is on the substrate within the cell region. The memory cell includes a memory gate structure on the substrate. A selection gate structure on the substrate. A first spacer is sandwiched between or respectively on sidewalls of the memory cell structure and the selection gate structure. A first high-voltage transistor is on the substrate within the high-voltage region. A first composite gate structure of the first high-voltage transistor includes a first gate structure on the substrate, an insulating layer with a predetermined thickness on the substrate in a ⌐-like structure or an L-like structure at cross-section, and a second gate structure on the insulating layer along the ⌐-like structure or the L-like structure. The insulating layer and the first spacer are originated from a same preliminary dielectric layer. The selection gate structure and the second gate structure are originated from a same preliminary conductive layer.

In an embodiment, as to the structure of semiconductor device, it further includes a second spacer on outer sidewall of the selection gate structure or on the first spacer, on a sidewall of the insulating layer with the second gate structure and on a sidewall of the first gate structure.

In an embodiment, as to the structure of semiconductor device, a length of a bottom horizontal portion of the ⌐-like structure or the L-like structure is set by a predetermined value.

In an embodiment, as to the structure of semiconductor device, the insulating layer of the high-voltage transistor is directly sandwiched between the first gate structure and the second gate structure.

In an embodiment, as to the structure of semiconductor device, the insulating layer of the high-voltage transistor is the ⌐-like structure, and a top horizontal portion of the ⌐-like structure is overlapping with the first gate structure.

In an embodiment, as to the structure of semiconductor device, the first gate structure includes a partial mask at top of the first gate structure and under the top horizontal portion of the insulating layer.

In an embodiment, as to the structure of semiconductor device, the insulating layer of the high-voltage transistor is the L-like structure, and a vertical portion of the L-like structure is directly sandwiched between the first gate structure and the second gate structure.

In an embodiment, as to the structure of semiconductor device, the memory gate structure comprises an oxide/nitride/oxide (ONO) layer and a conductive gate layer, sacked on the substrate, the selection gate is adjacent to the memory gate structure.

In an embodiment, as to the structure of semiconductor device, it further includes a second high-voltage transistor having a second composite gate structure being symmetrical to the first composite gate structure, wherein a region of the substrate between the first composite gate structure and the second composite gate structure comprises doped consecutive regions of N-type, P-type and N-type (NPN) or PNP.

In an embodiment, as to the structure of semiconductor device, it further includes a first-type doped region under each of the first composite gate structure and the second composite gate structure, and a second-type doped region between the two first-type doped regions under the doped region of NPN or PNP.

In an embodiment, the invention also provides a structure of semiconductor device. The structure semiconductor device includes a substrate, configured to have a cell region and a high-voltage region. A memory cell is on the substrate within the cell region. The memory cell includes a memory gate structure on the substrate. A selection gate structure on the substrate. A first spacer is sandwiched between or respectively on sidewalls of the memory cell structure and the selection gate structure. A first high-voltage transistor is on the substrate within the high-voltage region. A first composite gate structure of the first high-voltage transistor includes a first gate structure on the substrate, an insulating layer with a predetermined thickness on the substrate in ⌐-like structure or an L-like structure at cross-section, and a second gate structure on the insulating layer along the ⌐-like structure or the L-like structure. The selection gate structure and the second gate structure are originated from a same preliminary conductive layer.

In an embodiment, the invention also provides a method for fabricating semiconductor device. The method includes providing a substrate, configured to have a cell region and a high-voltage region. A memory cell is formed on the substrate within the cell region. The memory cell includes a memory gate structure on the substrate, a selection gate structure on the substrate, and a first spacer sandwiched between or respectively on sidewalls of the memory cell structure and the selection gate structure. A first high-voltage transistor is formed on the substrate within the high-voltage region. A first composite gate structure of the first high-voltage transistor as formed includes a first gate structure on the substrate. An insulating layer with a predetermined thickness on the substrate is a ⌐-like structure or an L-like structure at cross-section. A second gate structure is on the insulating layer along the ⌐-like structure or the L-like structure. The insulating layer and the first spacer are formed from a same preliminary dielectric layer or from different preliminary dielectric layers. The selection gate structure and the second gate structure are originated from a same preliminary conductive layer.

In an embodiment, as to the method for fabricating semiconductor device, it further includes forming a second spacer on outer sidewall of the selection gate structure or on the first spacer, on a sidewall of the insulating layer with the second gate structure and on a sidewall of the first gate structure.

In an embodiment, as to the method for fabricating semiconductor device, a length of a bottom horizontal portion of the ⌐-like structure or the L-like structure is set to a predetermined value by a patterning process.

In an embodiment, as to the method for fabricating semiconductor device, the insulating layer of the high-voltage transistor as formed is directly sandwiched between the first gate structure and the second gate structure.

In an embodiment, as to the method for fabricating semiconductor device, the insulating layer of the high-voltage transistor as formed is the ⌐-like structure, and a top horizontal portion of the ⌐-like structure is overlapping with the first gate structure.

In an embodiment, as to the method for fabricating semiconductor device, the first gate structure as formed includes a partial mask at top of the first gate structure and under the top horizontal portion of the insulating layer.

In an embodiment, as to the method for fabricating semiconductor device, the insulating layer of the high-voltage transistor as formed is the L-like structure, and a vertical portion of the L-like structure is directly sandwiched between the first gate structure and the second gate structure.

In an embodiment, as to the method for fabricating semiconductor device, the memory gate structure as formed comprises an oxide/nitride/oxide (ONO) layer and a conductive gate layer, sacked on the substrate, the selection gate is adjacent to the memory gate structure.

In an embodiment, as to the method for fabricating semiconductor device, it further includes simultaneously forming a second high-voltage transistor having a second composite gate structure being symmetrical to the first composite gate structure; and forming doped consecutive regions of N-type, P-type and N-type (NPN) or PNP at a region of the substrate between the first composite gate structure and the second composite gate structure.

In an embodiment, as to the method for fabricating semiconductor device, it further includes forming a first-type doped region under each of the first composite gate structure and the second composite gate structure, and forming a second-type doped region between the two first-type doped regions under the doped region of NPN or PNP.

In order to make the aforementioned and other objectives and advantages of the present invention comprehensible, embodiments accompanied with figures are described in detail below.

DESCRIPTION OF THE EMBODIMENTS

The invention provides a semiconductor device, which includes a memory device in a cell region and a transistor at a high voltage (HV) region. To the structure for fabrication, the method for fabricating the semiconductor device may be more organized in compatible condition to fabricate the structures respectively at the cell region and the HV region.

The invention in an embodiment proposes a BCD structure by fabricating a memory cell with the modified structure of HV MOS. The memory cell in an embodiment may be a structure of semiconductor/oxide/nitride/oxide/semiconductor (SONOS) as an example. The fabrication of HV MOS may have more compatibility with the fabrication procedure for the SONOS cell. Then, the HV device may be fabricated in better quality with the fabrication procedure being better compatible for the fabrication of the memory cells.

Multiple embodiments are provided for descriptions, but the invention is not just limited to the embodiments. In addition, a combination may also be made between the embodiments.

To operate at the HV range, the transistor needs to be modified in structure to have additional gate plate layer. The gate plate layer would provide a sufficient distance from the gate layer to the drain region to have proper operation for the HV transistor, so as to at least maintain the sufficient breakdown voltage under the HV operation. The invention proposes structures of HV transistor in the semiconductor device. The HV transistor may be fabricated at the HV region by more compatible processes for the non-volatile memory cell fabricated at the cell region and have better control for increasing the distance from the gate structure to the drain region.

Figure 1:
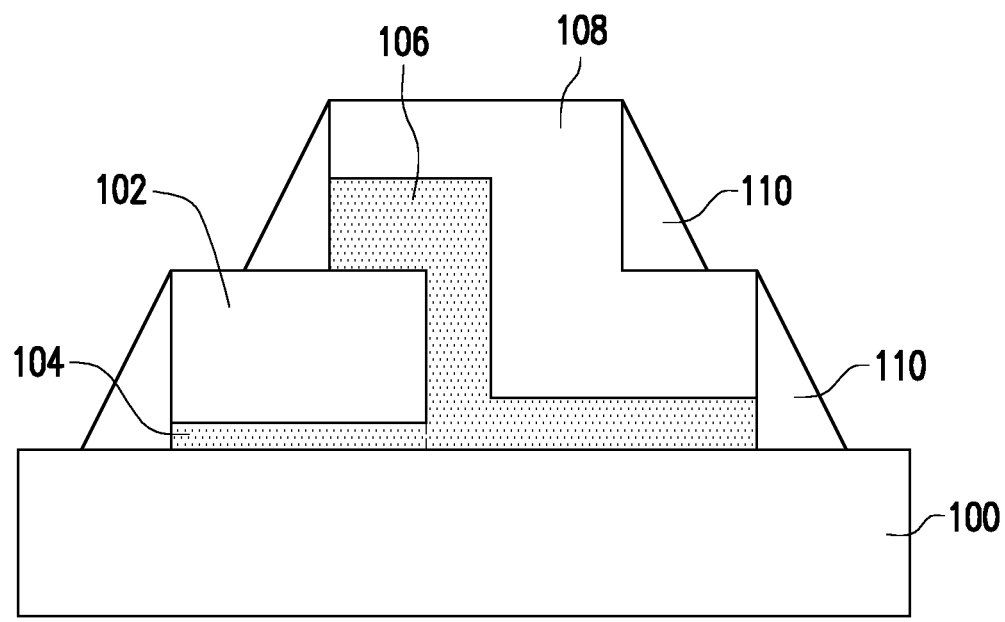
FIG. 1 is a drawing, schematically illustrating a structure of semiconductor device, according to an embodiment of the invention.

FIG. 1 is a drawing, schematically illustrating a structure of semiconductor device, according to an embodiment of the invention.

Referring to FIG. 1, before describing the semiconductor device, the structure of HV transistor as to be integrated in the semiconductor device is described. In an embodiment, a structure of HV transistor is fabricated on a substrate 100. The source region and the drain region have been formed in the substrate 100 and known to the art. The descriptions about the source region and the drain region here are omitted. The gate structure for the HV transistor is described in detail.

A gate insulating layer 104 and a gate layer 102 in stack are formed on the substrate 100 to serve as a gate structure. To properly operate at the HV range, a dielectric layer 106 is further formed on a portion of a top of the gate layer 102, one a sidewall of the gate structure and on the substrate 100.

The dielectric layer 106 in an embodiment may be a ⊥-like structure. An additional gate plate layer 108 is formed on the dielectric layer 106 with the ⊥-like structure. Here, to have the dielectric layer 106 with the ⊥-like structure, the gate layer 102 may also include a mask structure at top to support the ⊥-like structure, as to be described later in detail. Then, the gate plate layer 108 is formed on the dielectric layer 106 with the ⊥-like structure as well. In operation, the gate layer 102 and the gate plate layer 108 are applied with the same gate voltage. Due to the bottom horizontal portion of the gate plate layer 108, the distance from the gate layer 102 to the drain region at the HV side can have the distance being well controlled by patterning process. The gate plate layer 108 may provide the additional effect to control the drift region. As a result, the breakdown voltage may be increased, so to tolerate the HV operation.

In addition, various spacers 110 may be further formed to protect the HV transistor without specific limitation in the invention.

As to the HV transistor in the embodiment, it has compatible fabrication process with the cell device at the cell region, as to be described later.

Figure 2:
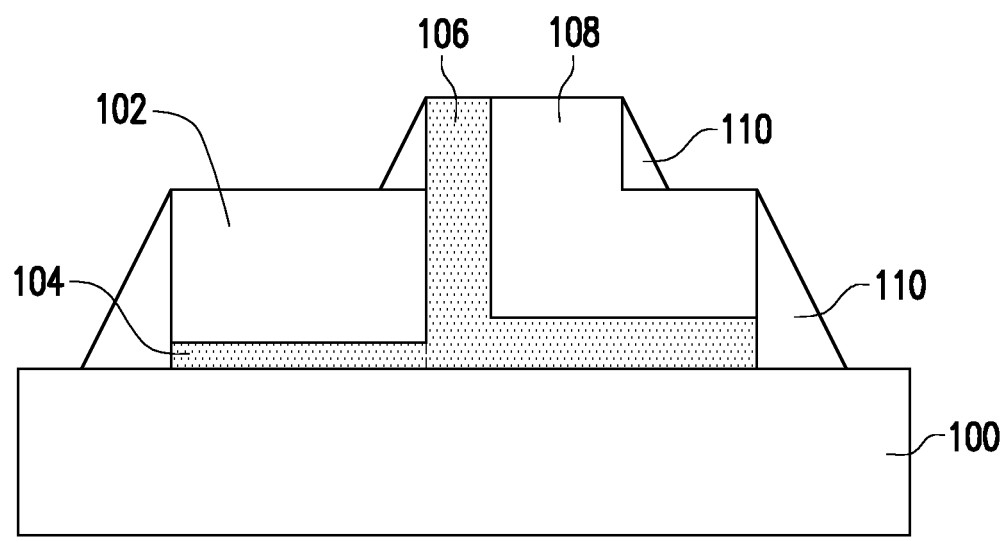
FIG. 2 is a drawing, schematically illustrating a structure of semiconductor device, according to further an embodiment of the invention.

In a further embodiment, the HV transistor mat be further modified. FIG. 2 is a drawing, schematically illustrating a structure of semiconductor device, according to further an embodiment of the invention.

Referring to FIG. 2, in comparing with the structure of HV transistor in FIG. 1, the dielectric layer 106 may be an L-like structure. In this situation, the gate plate layer 108 on the dielectric layer 106 is also an L-like structure. However, the bottom horizontal portion of the gate plate layer 108 still remains. The size of the bottom horizontal portion may be well controlled in size by the patterning process.

Figure 3:
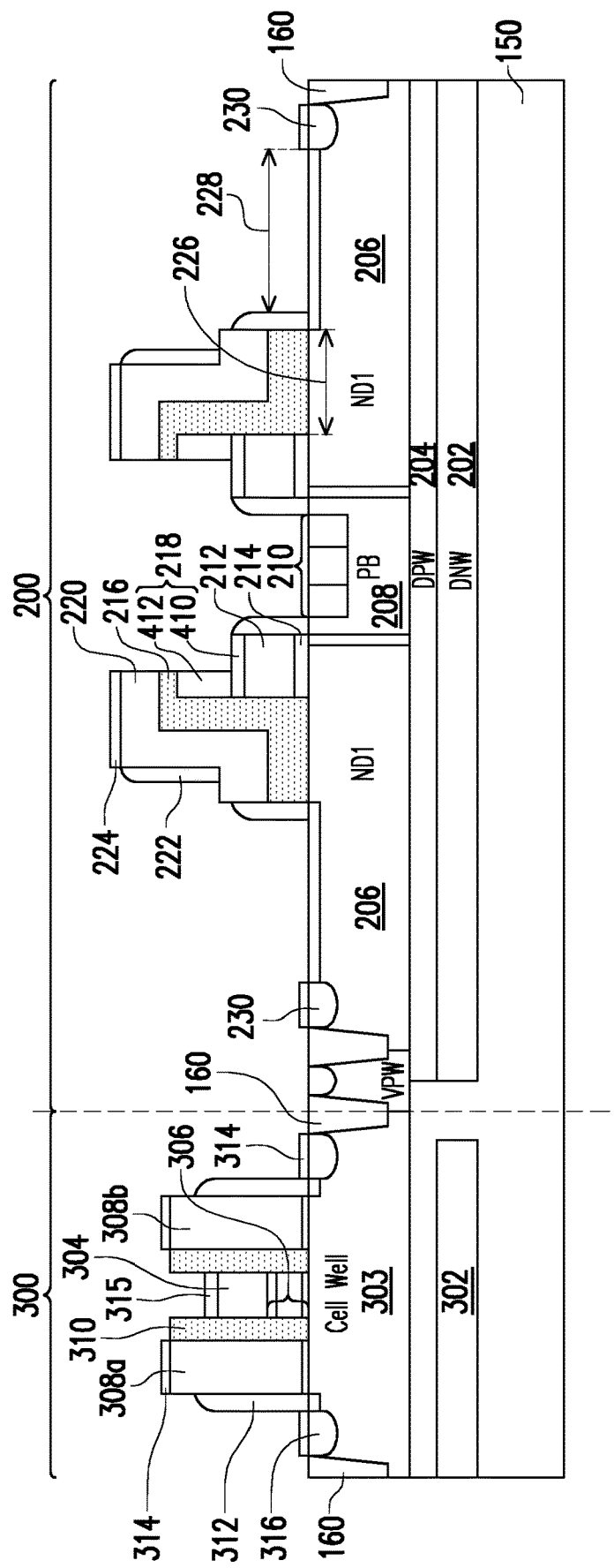
FIG. 3 is a drawing, schematically illustrating a structure of semiconductor device, according to further an embodiment of the invention.

FIG. 3 is a drawing, schematically illustrating a structure of semiconductor device, according to further an embodiment of the invention. Referring to FIG. 3, a semiconductor device, such as the BCD device, may include the memory device and the HV device in fabrication. The structure of the semiconductor device in an embodiment is described.

The substrate 150 is configured to have a HV region 200 and a cell region 300. As known, the HV region 200 and a cell region 300 may be or not directly next to each other. However, to easy description, the HV region 200 and a cell region 300 are drawn next to each other as an example. The isolation structures 160, such as shallow trench isolation (STI) structure, are formed in the substrate 150 to isolate the device active regions. In addition, various doped regions may be formed in the substrate 150 according to the device to be formed on the substrate 150.

In an example, in the cell region 300, the doped region 302 and the cell well 303 may be formed in the substrate 150. In addition, the doped regions 316 may be also formed in the substrate 150. At least a part of the doped regions 316 in an embodiment may provide as the function of source/drain regions. In the HV region 200, the deep N-type doped region (DNW) 202 and the deep P-type doped region (DPW) 204 are formed in the substrate. In an embodiment, to have two HV transistors in symmetric to each other to be formed, two N-type dope regions 206, as also indicated by ND1, are formed in the substrate 150 above the deep P-type doped region 204. A P-type dope region 208, as also indicated by PB, is in the substrate 150 on the deep P-type doped region 204 and between the two N-type dope regions 206. The drain regions 230 and source region 210 are formed in the substrate 150, respectively in the N-type dope regions 206 and the P-type dope region 208. A lightly doped region within the region 228 between the gate structure and the drain region 230 is also formed, in an embodiment. Further, a P-type doped region as also indicated by VPW in the substrate 150 between STI structures 160 at the interface region between the HV region 200 and the cell region 300 may be also formed but the invention is not limited to.

The doped structures in the substrate 150 are depending on the structure to be formed on the substrate 150. As noted, the doped structures in the substrate 150 are not just limited to the embodiment. The invention does not limit the doped structures.

The gate structures are described in the following. In the cell region 300, the memory cell is a SONOS cell with three-transistor (3T) structure as an example, in which three gate structures are involved. The three gate structures include one memory gate layer 304, a selection gate layer 308a and a selection gate layer 308b at both sides of the memory gate layer 304. In an embodiment, the memory gate structure includes the memory gate layer 304 and a charge storage layer 306, such as an ONO layer, between the memory gate layer 304 and substrate 150. Each of the selection gate structure includes the selection gate layer 308a, 308b with the gate insulating layer at bottom on the substrate 150. The spacers 312 are formed on the outer sidewalls of the selection gate layers 308a, 308b.

As noted, the dielectric layer 310 is between the memory gate layer 304 with the charged storage layer 306 and the selection gate layers 308a, 308b with the gate insulating layer. The dielectric layer 310 may be oxide in an embodiment and formed at the inner sidewalls of the selection gate layers 308a, 308b. A salicide layer 314 may be formed on the exposed silicon surface of the selection gate layers 308a, 308b and the doped regions 316. A mask layer 315 may be disposed on the memory gate layer 304. Here, the mask layer 315 is just an example and the invention is not limited to.

In the HV region 200, based on the basic structure in FIG. 1, a gate layer 212 with a gate insulating layer 214 as a gate structure is formed on the substrate 150 within the N-type doped region 206. A dielectric layer 218 is disposed on a portion of the top of the gate layer 212 while the other portion of the top of the gate layer 212 is formed as a salicide layer in an example, but the invention is not limited to.

The dielectric layer 218 in an example includes nitride with the oxide. The dielectric layer 218 also provides as an insulating material to the gate plate layer 220. Another dielectric layer 216 is formed on the dielectric layer 218, the sidewall of the gate layer 212 with the gate insulating layer 210, and on the substrate 150, in which the dielectric layer 216 has ⌐-like structure. In an embodiment, the dielectric layer 216 may be originated from the same preliminary dielectric layer for forming the dielectric layer 310 in the cell region 300. However, in another embodiment, the dielectric layer 216 may be not necessarily originated from the same preliminary dielectric layer.

As noted in an embodiment, the dielectric layer 218 includes a nitride mask layer 412 and a buffer oxide layer 410. The nitride mask layer 412 is a nitride portion and may be treated as a partial mask, generally included as a part of the gate structure. The nitride mask layer 412 is at the top of the gate structure and under the horizontal portion of the dielectric layer 216 with the ⌐-like structure. A gate plate layer 220 is further formed on the dielectric layer 216 layer with the ⌐-like structure, so the gate plate layer 220 is also a ⌐-like structure.

As noted, the dielectric layer 216 is formed by patterning on the preliminary dielectric layer, the bottom horizontal portion 226 of the dielectric layer 216 may be well controlled, and then the size of the region 228 between the gate structure and the drain region 230 is well controlled. As a result, the breakdown voltage may be maintained sufficiently high.

In addition, the top of the gate plate layer 220 may be formed with a salicide layer 224 and the source/drain regions 230. Multiple spacers 222 are formed on the outer sidewalls of the gate plate layer 220. However, the invention is not limited to the salicide layer 224 and the spacer 222 in the embodiment. In an embodiment, the source region 210 is composed of N-type doped region, P-type doped region and N-type doped region as an NPN structure, wherein the two N-type doped regions serving as the source region are separated by the P-type doped region. However, PNP may also be formed for the LDPMOS. The two HV transistors may be formed symmetrically. However, the invention is not just limited to the embodiment.

In operation, the gate plate layer 220 is also applied with the same gat voltage on the gate layer 212, as stated in FIG. 1. Due to the dielectric layer 216 and the gate plate layer 220, the breakdown voltage may be maintained sufficiently high.

Figure 4:
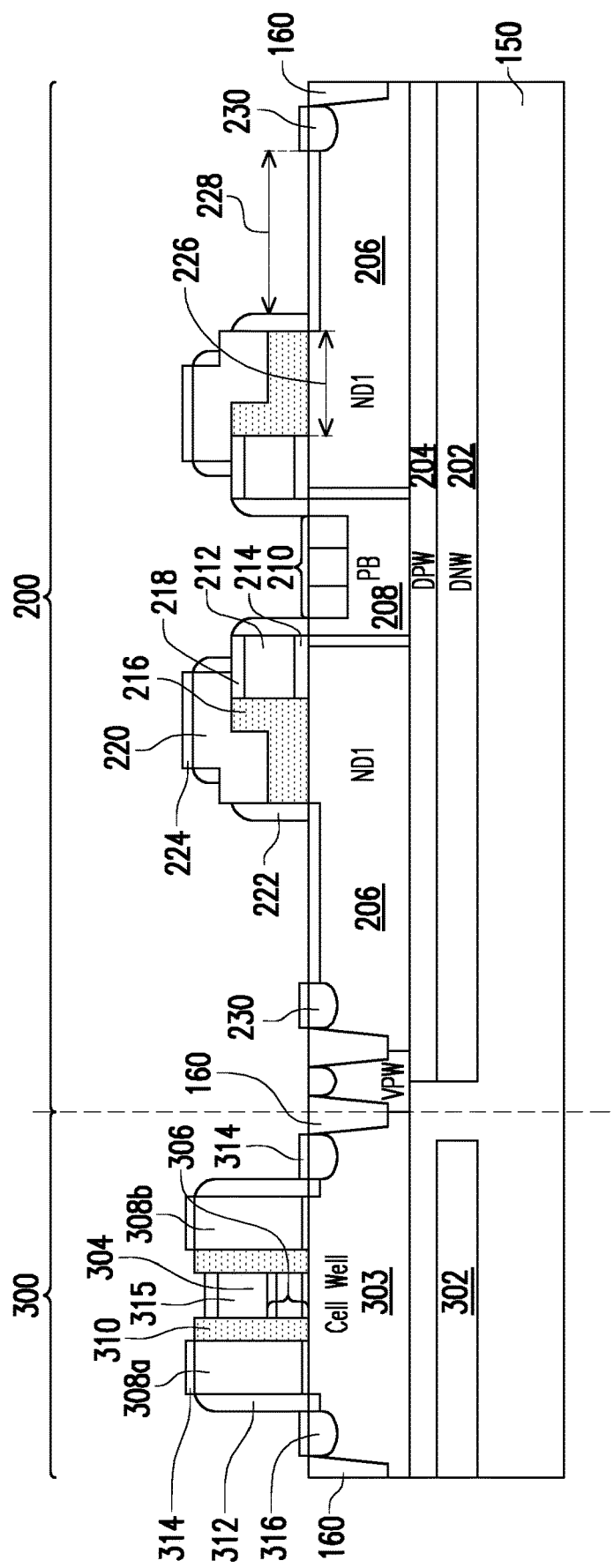
FIG. 4 is a drawing, schematically illustrating a structure of semiconductor device, according to further an embodiment of the invention.

As also stated in FIG. 2, the nitride portion of the dielectric layer 218 at top of the gate layer may be not included in fabrication, then the dielectric layer 216 becomes the L-like structure. In more detail, FIG. 4 is a drawing, schematically illustrating a structure of semiconductor device, according to further an embodiment of the invention. Referring to FIG. 4, in an embodiment, a modification on the structure in FIG. 3 is further taken. The dielectric layer 218 in the embodiment does not include the nitride portion 412 as shown in FIG. 3, then the dielectric layer 218 is the buffer oxide layer as the oxide portion in the embodiment. In this structure, the dielectric layer 216 needs not to extend over the gate layer 212 and becomes the L-like structure.

The HV transistor in the HV region 200 is still working well with high breakdown voltage. The memory cell in the cell region 300 in an embodiment may also include 3T structure. In this situation, the height of the selection gate layer 308a, 308b is reduced by a height from the removed nitride portion of the dielectric layer 218.

In a further embodiment, the structure of the memory cell in FIG. 3 and FIG. 4 may be modified to two-transistor (2T) structure, which includes one memory gate structure and one selection gate structure.

Figure 5:
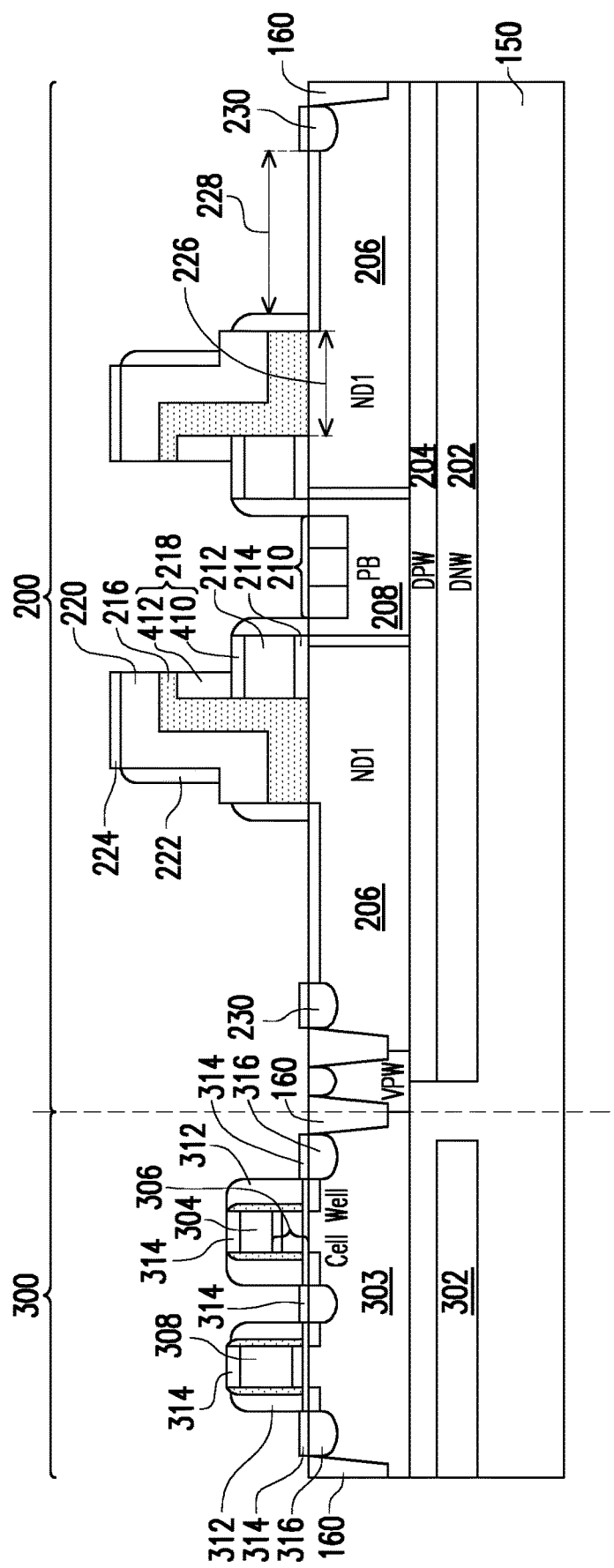
FIG. 5 is a drawing, schematically illustrating a structure of semiconductor device, according to further an embodiment of the invention.

Referring to FIG. 5, the structure of HV transistors in the HV region 200 may be the same as the structure of the HV transistor in FIG. 3, in which the dielectric layer 218 includes the nitride portion. However, the structure of the memory cell in the cell region 300 is 2T structure.

The memory gate structure in the cell region 300 also includes the memory gate layer 304 with the charge storage layer 306, such as ONO layer. The selection gate structure includes the selection gate layer 308 with the gate insulating layer at bottom. Multiple doped regions 316 are also formed in the substrate 150 at sides of the selection gate layer 308 with the gate insulating layer and the memory gate layer 304 with the charge storage layer 306. The spacers 312 are formed on the sidewalls of the selection gate layer 308 with the gate insulating layer and the memory gate layer 304 with the charge storage layer 306. As noted, the spacers 312 may be double layers, in which the inner spacer may be originated from the same or different preliminary dielectric layer for forming the dielectric layer 216 in the HV region 200. The salicide layer 314 may be further formed on top of the selection gate layer 308, the memory gate layer 304 and on the doped region 316. However, the invention is not limited to the embodiments.

Figure 6:
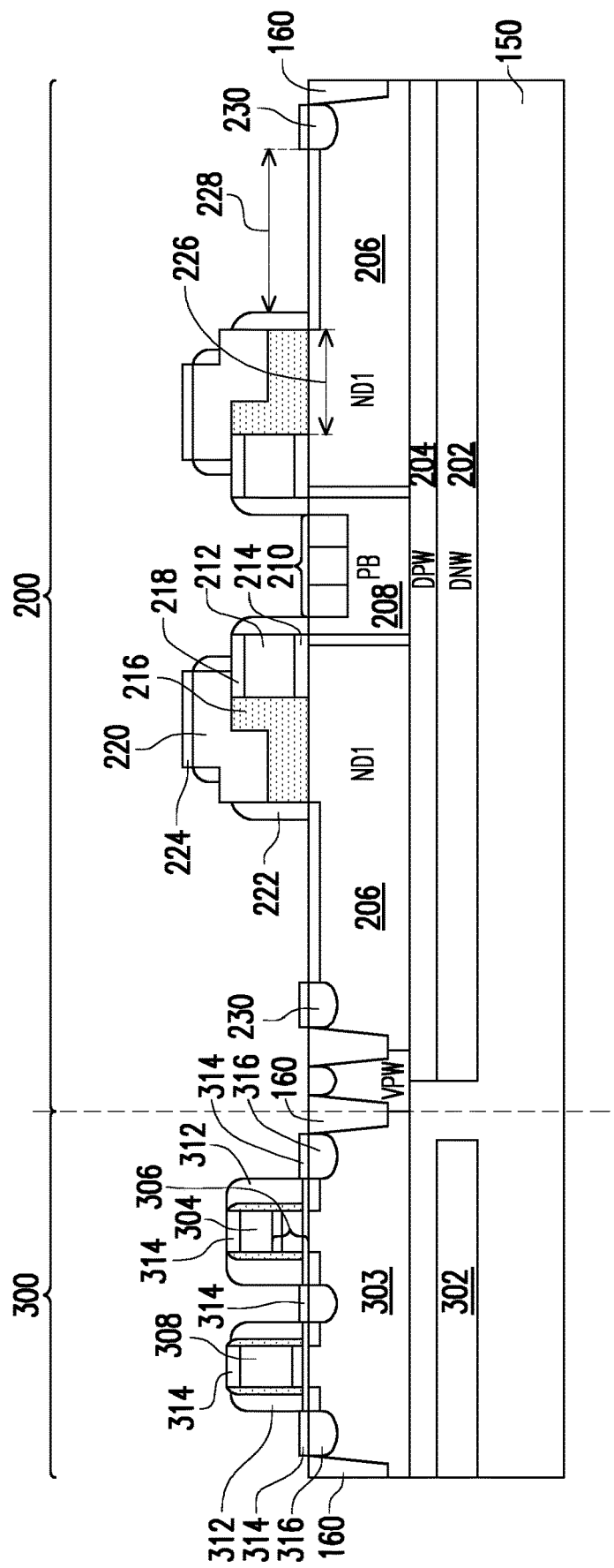
FIG. 6 is a drawing, schematically illustrating a structure of semiconductor device, according to further an embodiment of the invention.

FIG. 6 is a drawing, schematically illustrating a structure of semiconductor device, according to further an embodiment of the invention. Referring to FIG. 6, the same structure for the memory cell in 2T structure may be integrated with the HV transistor in FIG. 2 or in FIG. 4 at the HV region 200. The description about the HV transistor in the HV region 200 is omitted here. In this combination, the memory cell in 2T structure is the same as the structure in FIG. 5.

Figure 7:
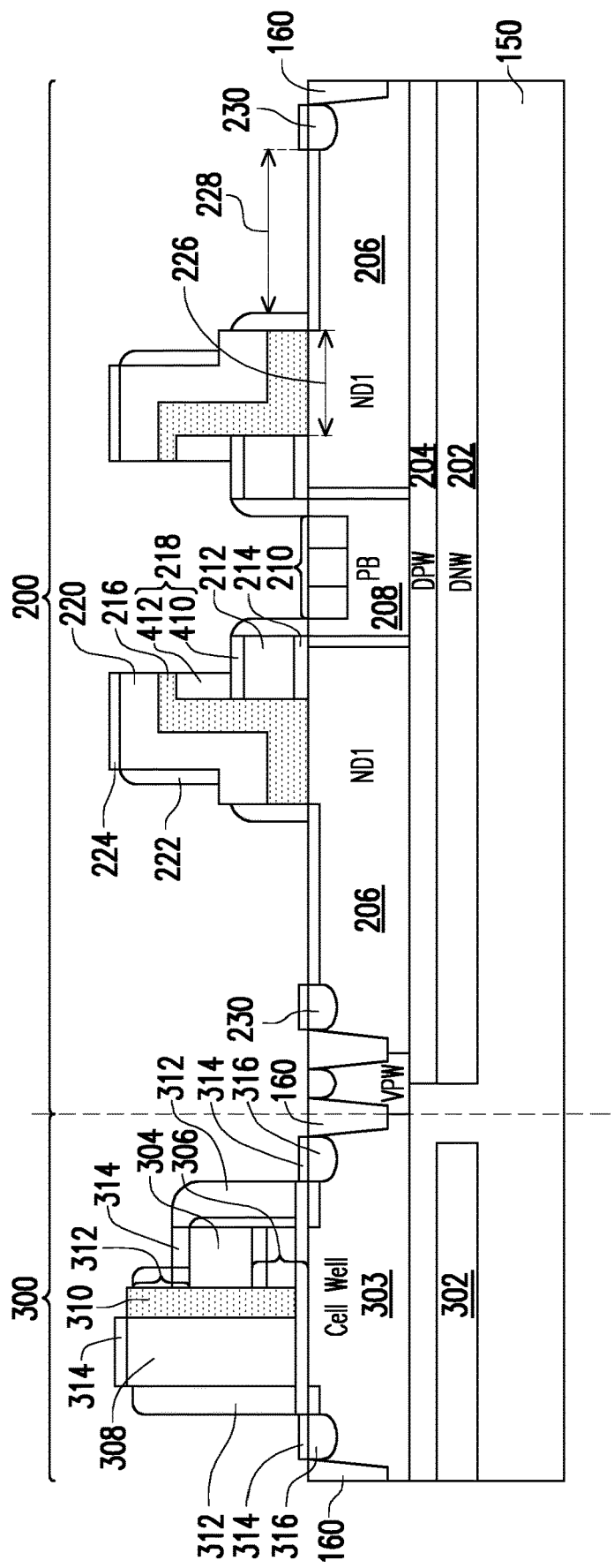
FIG. 7 is a drawing, schematically illustrating a structure of semiconductor device, according to further an embodiment of the invention.

FIG. 7 is a drawing, schematically illustrating a structure of semiconductor device, according to further an embodiment of the invention. Referring to FIG. 7, the memory cell in the cell region 300 may be further modified into the one and half transistors (1.5T), which include one memory gate layer 304 with charge storage layer 306, such as ONO layer, and one selection gate layer 308 with the gate insulating layer. The doped regions 316 in the substrate 150 are disposed at outer sides of the memory gate layer 304 and the selection gate layer 308, which are isolated by the dielectric layer 310. In the embodiment, there is no doped region in the substrate 150 between the memory gate layer 304 and the selection gate layer 308.

The memory cell in the cell region 300 is integrated with the HV transistor in the HV region 200 as stated in FIG. 3. The dielectric layer 218 on the gate layer 212 in the HV region 200 includes the nitride mask layer 412 as a nitride portion. The dielectric layer 220 may be formed as the ⌐-like structure. In this situation, the selection gate layer 308 is higher than the memory gate layer 304. The extra inner sidewall of the selection gate layer 308 may also be formed by the spacer 312. Likewise, the salicide 314 may be formed on the exposed silicon surface of the memory gate layer 304 and the selection gate layer 308.

Figure 8:
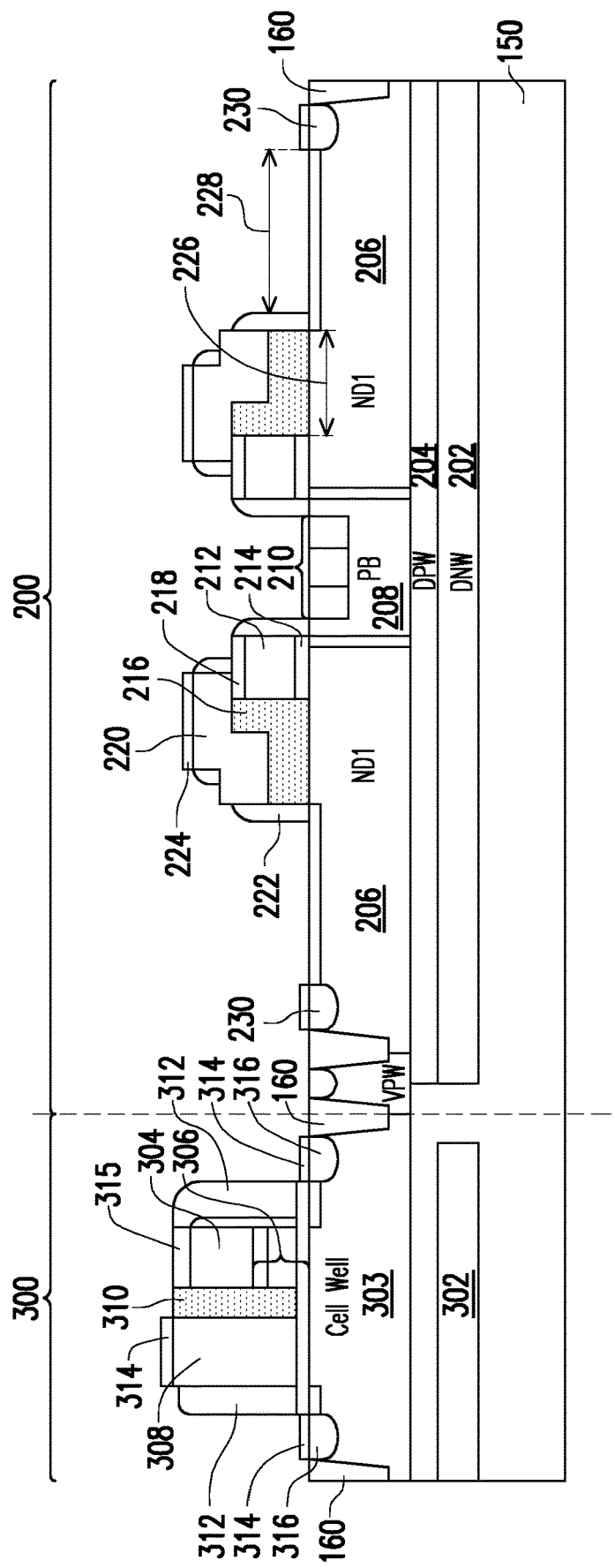
FIG. 8 is a drawing, schematically illustrating a structure of semiconductor device, according to further an embodiment of the invention.

FIG. 8 is a drawing, schematically illustrating a structure of semiconductor device, according to further an embodiment of the invention. Referring to FIG. 8, the HV transistor in the HV region 200 may involve the dielectric layer 220 with the L-like structure, as stated in FIG. 2 or FIG. 4. In this structure, the structure of the memory cell in the cell region 300 is slightly different from the structure of the memory cell in FIG. 7. Further, the mask layer 315 is formed on the top of the memory gate layer 304 as an embodiment. However in another embodiment, the mask layer 315 may be not removed in accordance with the subsequent fabrication procedures.

As noted in the foregoing embodiments, the HV transistor in the HV region includes the dielectric layer 216 in ⊥-like structure or L-like structure, in which the sidewall of the gate layer 212 is indeed a dielectric layer with the thickness as controlled, not in a structure of a spacer. The extension of the bottom horizontal portion may be well controlled, so as to assure the breakdown voltage in better control condition as expected in design.

To the method for fabricating the semiconductor device, the structure in FIG. 3 is taken as an example for description. FIG. 9A to FIG. 9T are drawings at cross-section view, schematically illustrating a fabrication flow of the method for fabricating semiconductor device, according to an embodiment of the invention.

Referring to FIG. 9A, the substrate 150 is configured to have a cell region 300 and a HV region 200. The STI structures 160 are formed in the substrate 150 to isolate the active regions. A pad oxide layer 400 is formed on the substrate 150.

In FIG. 9B, the deep N-type well (DNW) 202 is formed in the substrate 150 at the cell region 300. In FIG. 9C, a deep P-type region (DPW) 204 is formed in the substrate at the HV region 200. The additional STI structure 160 in the HV region 200 at the boundary region is formed and a P-type doped region 162 is formed in the substrate. The P-type doped region 162 in an embodiment is applied with low voltage such as 5V, it is also indicated VPW for easy note. However, the invention is not limited to the formation of the P-type doped region 162.

In FIG. 9D, two N-type dope regions 206 are formed in the substrate 150 in the HV region 200 with a separation, as reserved for subsequently forming two HV transistors later.

Figure 9E:
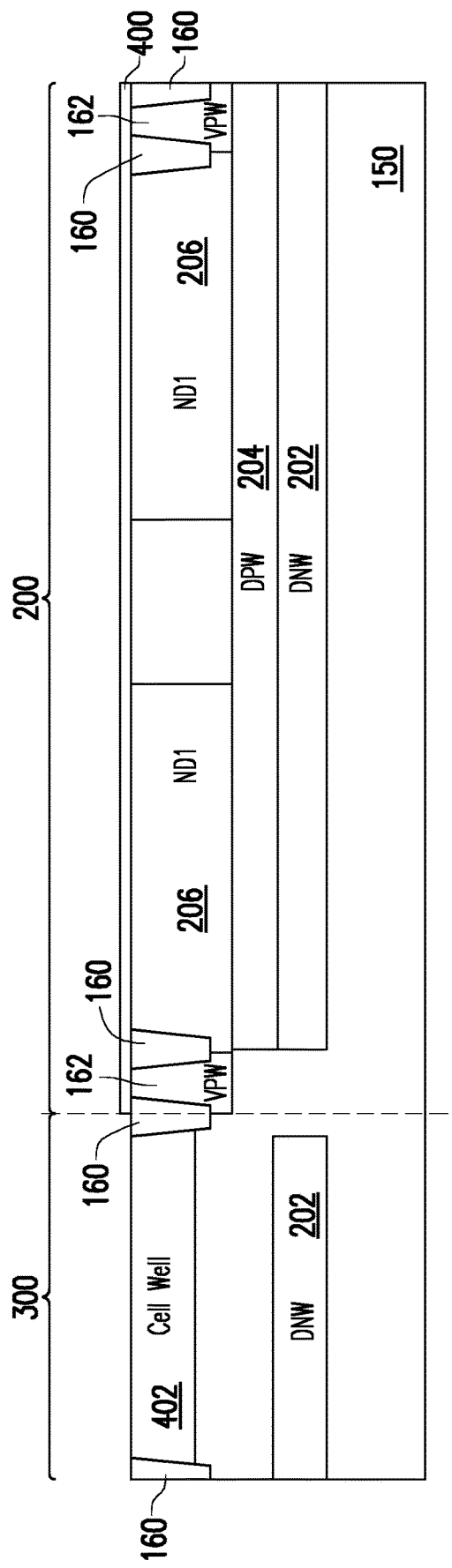
FIG. 9A to FIG. 9T are drawings at cross-section view, schematically illustrating a fabrication flow of the method for fabrication semiconductor device, according to an embodiment of the invention.

In FIG. 9E, a portion of the pad oxide layer 400 in the cell region 300 is removed. A cell well 402 is formed in the substrate at top portion in the cell region 300.

Figure 9F:
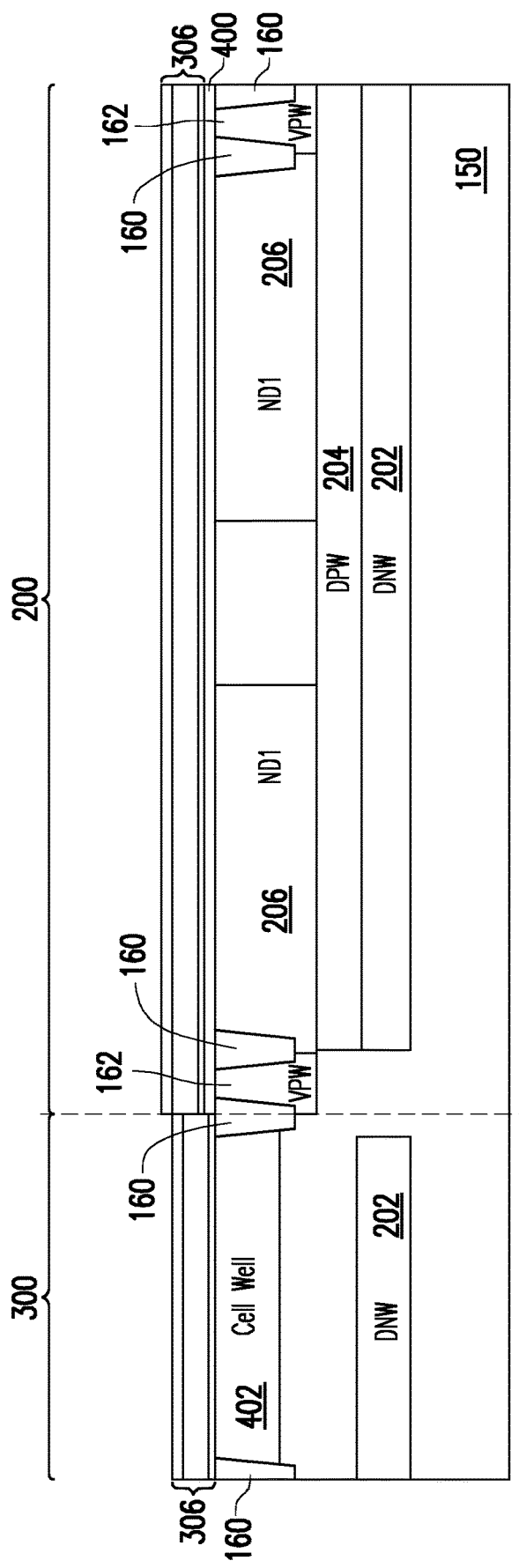

In FIG. 9F, a charge storage layer 306, such as ONO layer is globally formed over the substrate 105 in the cell region 300 and the HV region 200, in which the pad oxide layer 400 in the HV region 200 still remains.

Figure 9G:
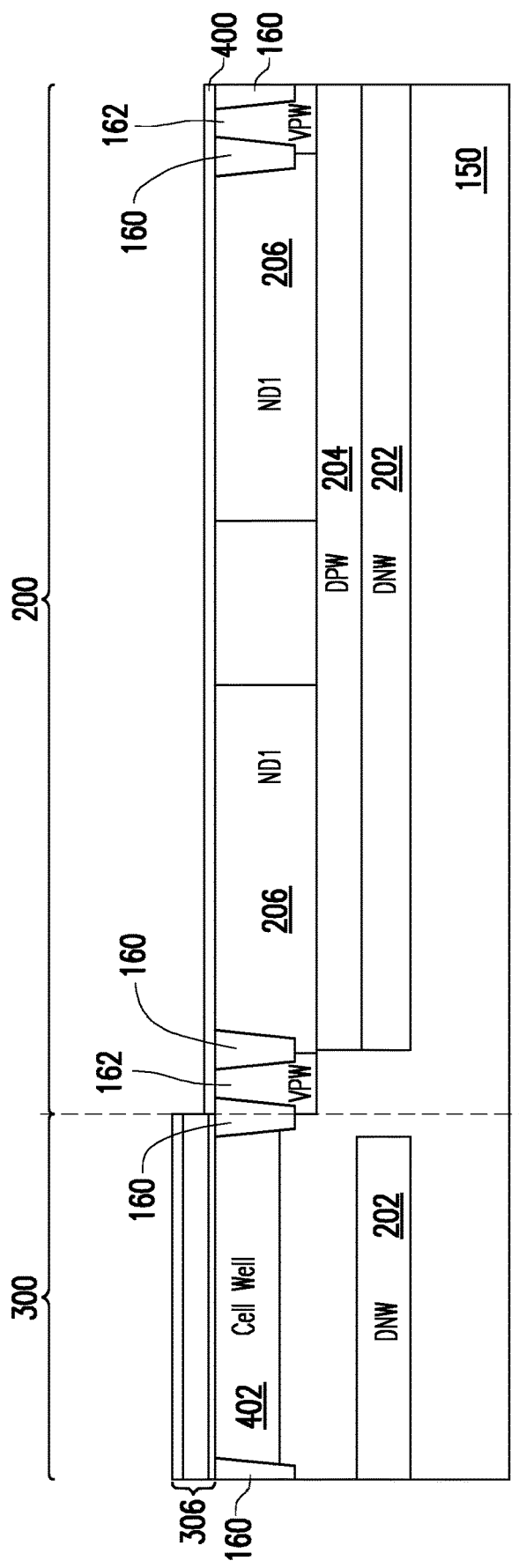

In FIG. 9G, a portion of the charge storage layer 306 in the HV region 200 is removed to expose the pad oxide layer 400.

Figure 9H:
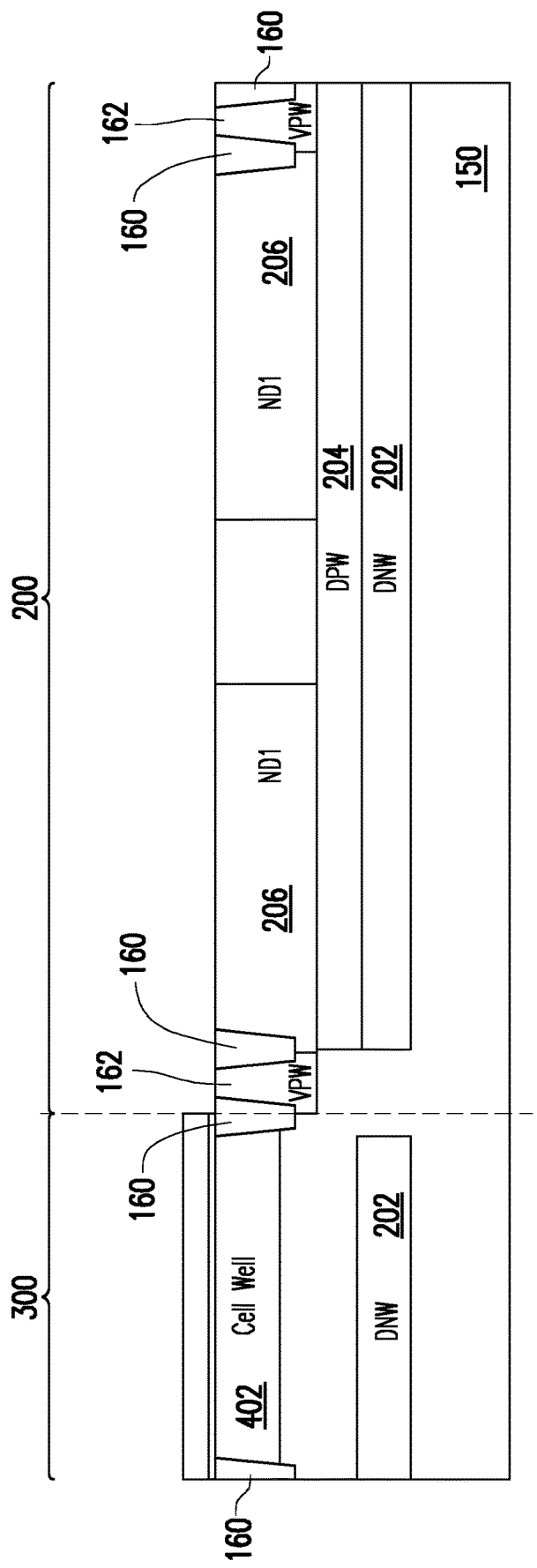

In FIG. 9H, the pad oxide layer 400 in the HV region 200 is removed.

However, the top oxide layer of the ONO layer of the charge storage layer 306 in an embodiment is also removed in the same process due to the same oxide material.

Figure 9I:
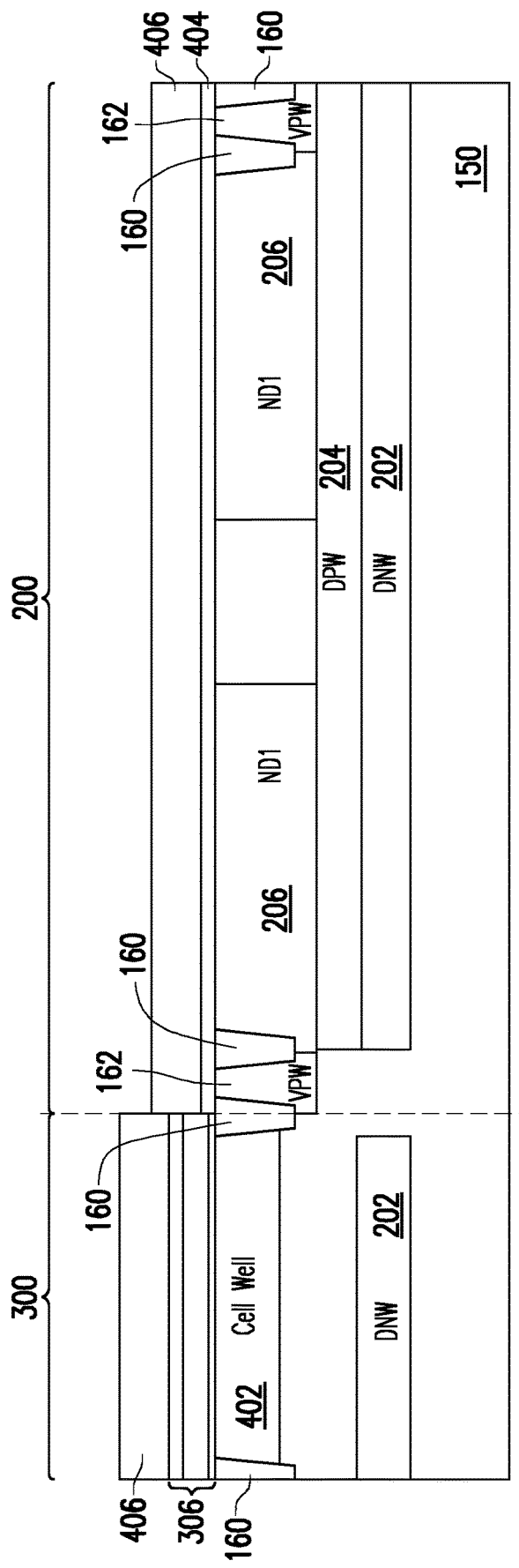

In FIG. 9I, a gate oxide layer 404 is globally formed in the cell region 300 and the HV region 200, in which the gate oxide layer 404 recovers the ONO structure for the charge storage layer 306 by providing the top oxide layer. A preliminary gate layer 406, such as polysilicon layer, is globally formed in the cell region 300 and the HV region 200.

Figure 9J:
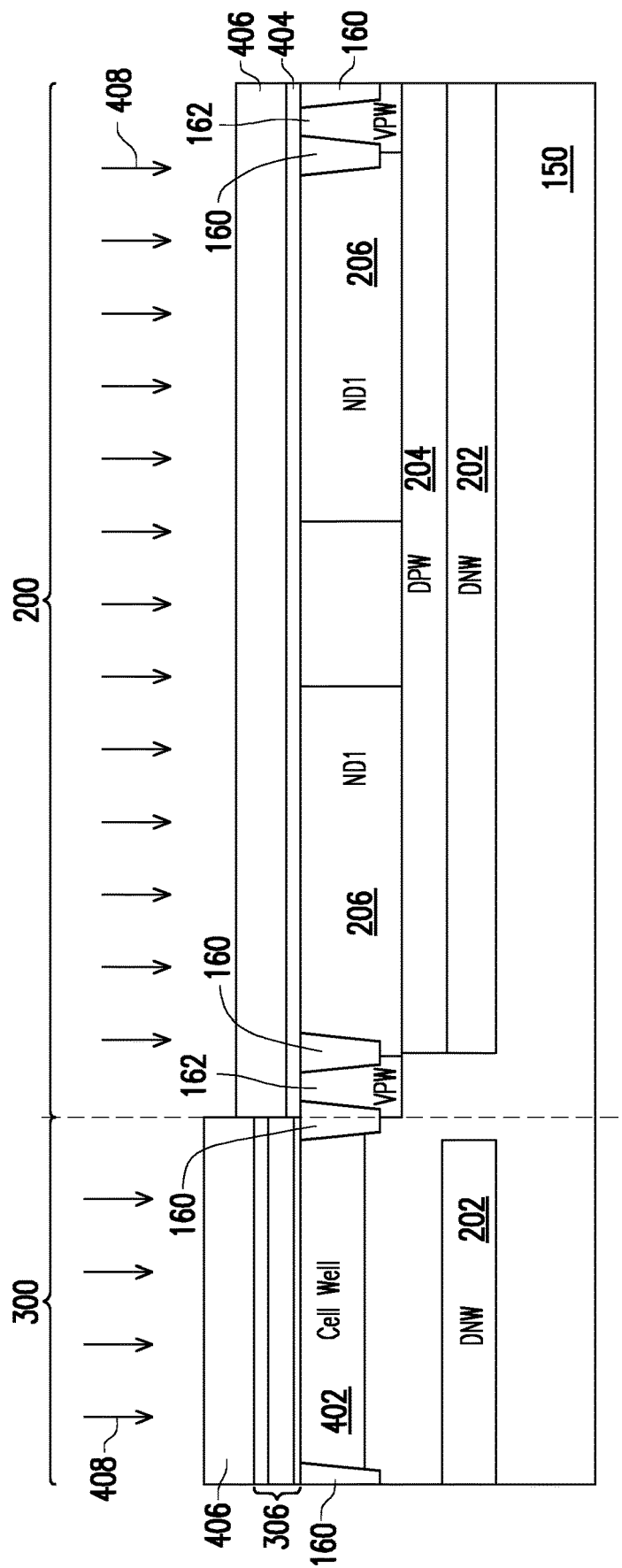

In FIG. 9J, an N-type implanting process 408 is performed in the cell region 300 and the HV region 200 on the preliminary gate layer 406.

Figure 9K:
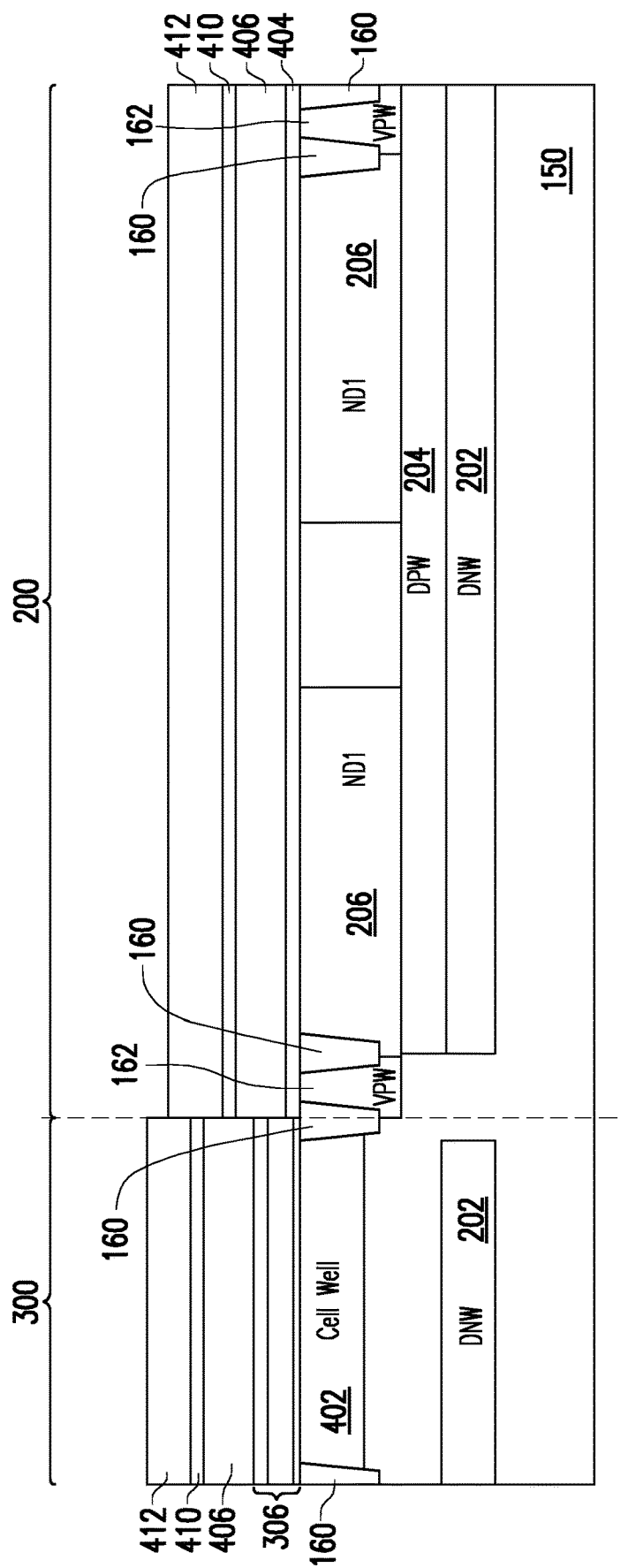

In FIG. 9K, for an embodiment, a buffer oxide layer 410 and a nitride mask layer 412 are sequentially formed over the substrate 150 in the cell region 300 and the HV region 200.

Figure 9L:
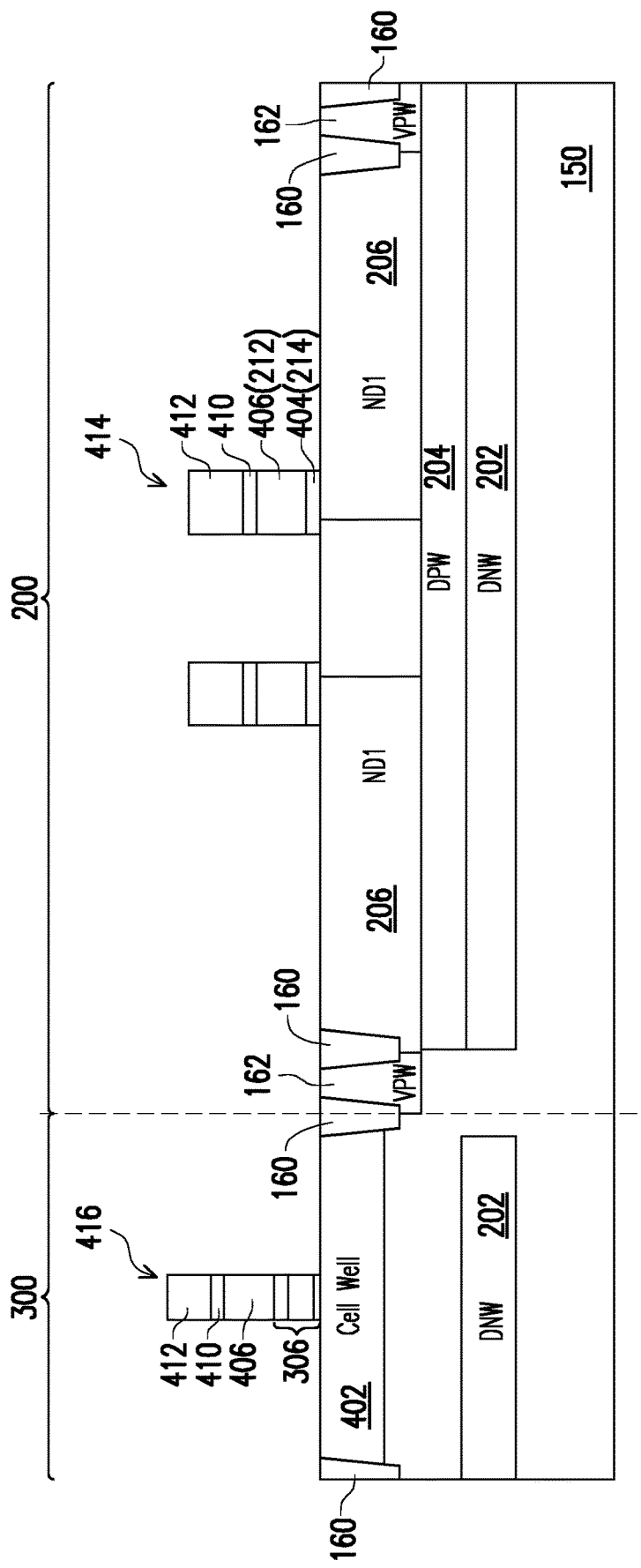

In FIG. 9L, the charge storage layer 306, the buffer oxide layer 410 and the nitride mask layer 412 in the cell region 300 is patterned into a memory gate structure 416 by a preliminary stack structure. In the HV region 200, the gate oxide layer 404, the preliminary gate layer 406, the buffer oxide layer 410 and the nitride mask layer 412 are patterned to have the gate structure 414. In an embodiment, the two gate structures 414 being symmetric to each other are taken as an example, but the invention is not just limited to. The gate oxide layer 404 and the preliminary gate layer 406 are also corresponding to the gate insulating layer 214 and the gate layer 212 as described in FIG. 3. The gate structures 414 are on the doped region 206 of the substrate 150, in an embodiment.

Figure 9M:
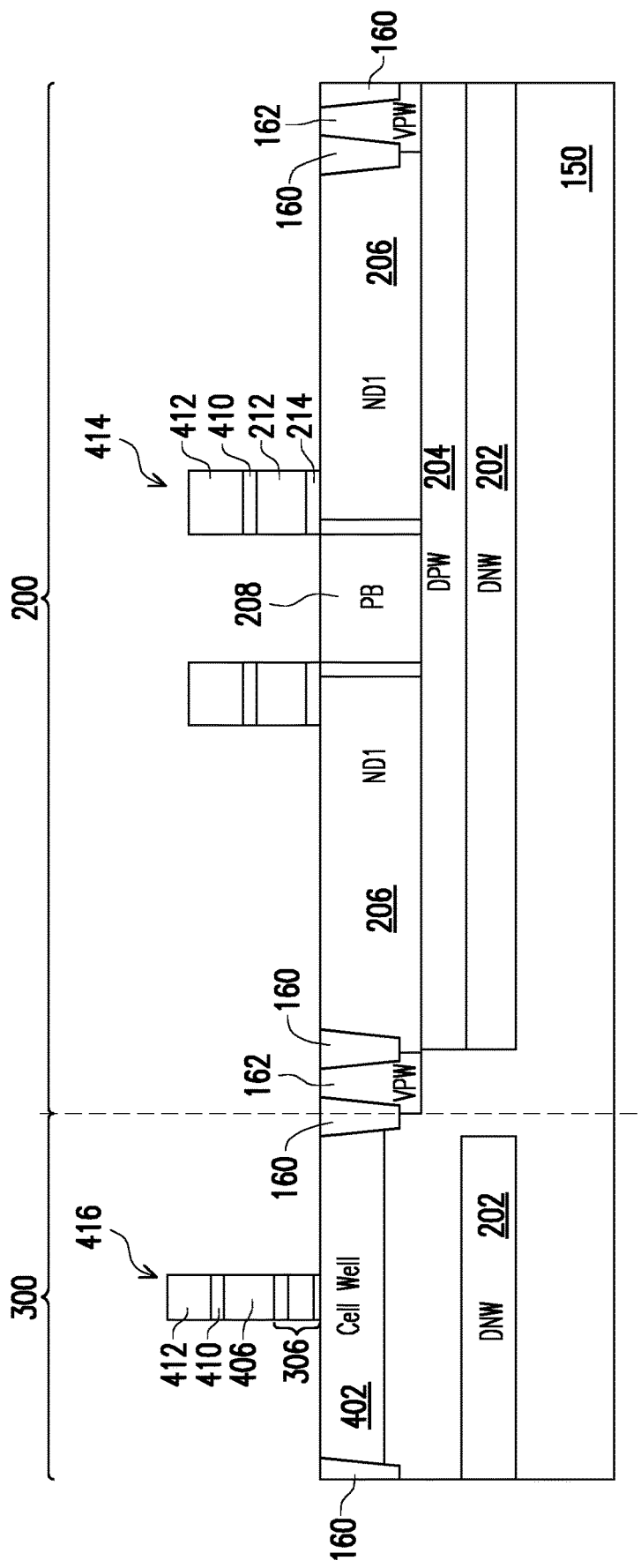

In FIG. 9M, a P-type doped region 208, indicated by PB, is formed in the substrate between the gate structures 414.

Figure 9N:
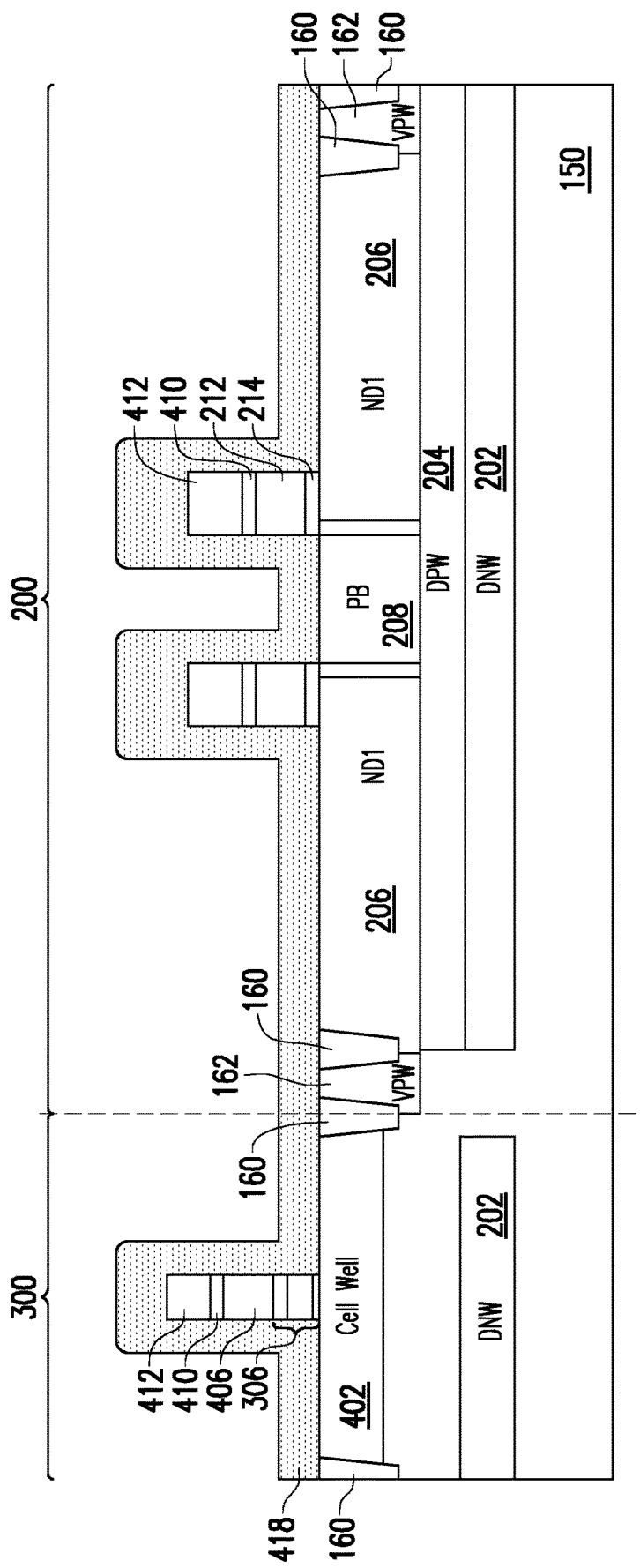
Figure 90:
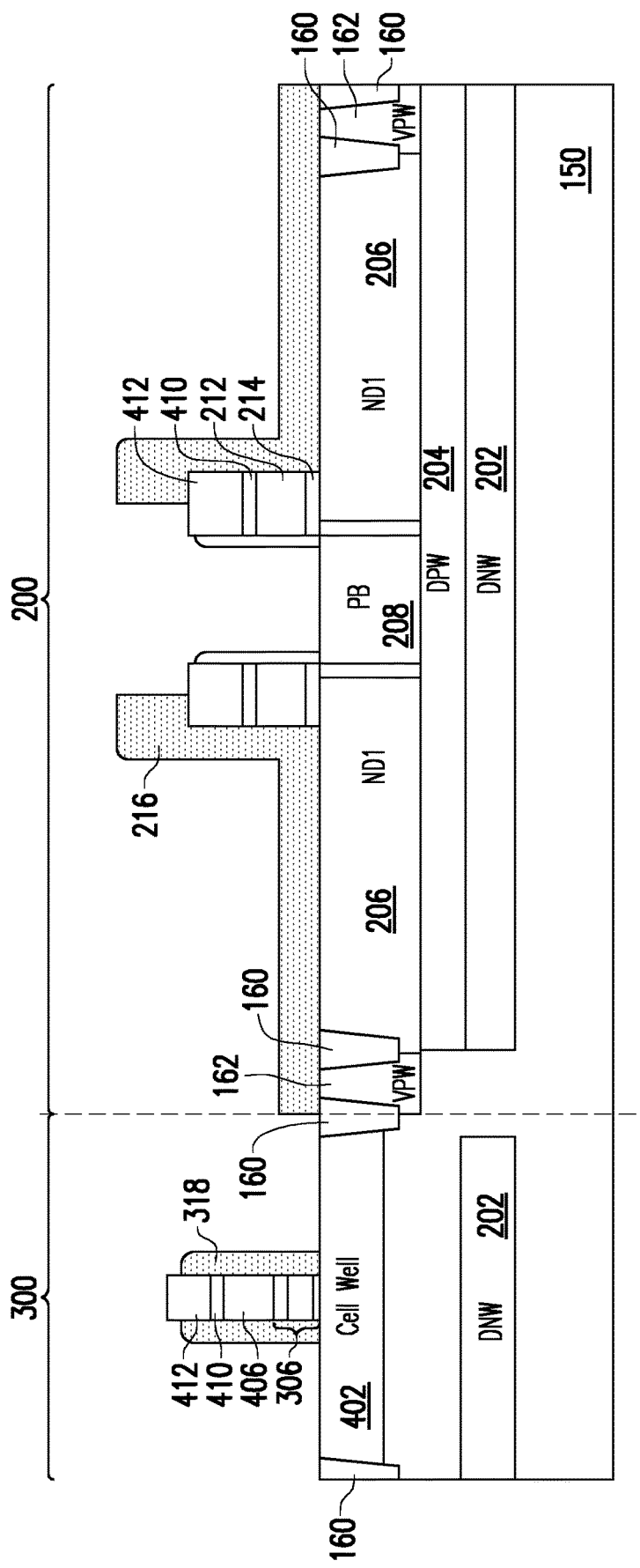

In FIG. 9N, as an embodiment, a preliminary dielectric layer 418 is globally and conformally formed over the substrate 150 to cover the gate structure 416 and gate structure 414. As noted, the preliminary dielectric layer 418 is used to form the dielectric layer 216 in ⊥-like structure or L-like structure later. In the embodiment, the ⊥-like structure is taken as an example.

In FIG. 9O, the preliminary dielectric layer 418 in the cell region 300 is patterned by etching back process in an example to form the dielectric layer 318, such as a spacer, on the sidewall of the gate structure including the gate layer 406 with the charge storage layer 306. The preliminary dielectric layer 418 in the HV region 200 is patterned into a dielectric layer 216, which partially expose the nitride mask layer 412 and expose the P-type doped region 208. A residual spacer may still remain on the inner sidewall of the nitride mask layer 412, the buffer oxide layer 410, the gate layer 212 and the gate insulating layer 214.

Figure 9P:
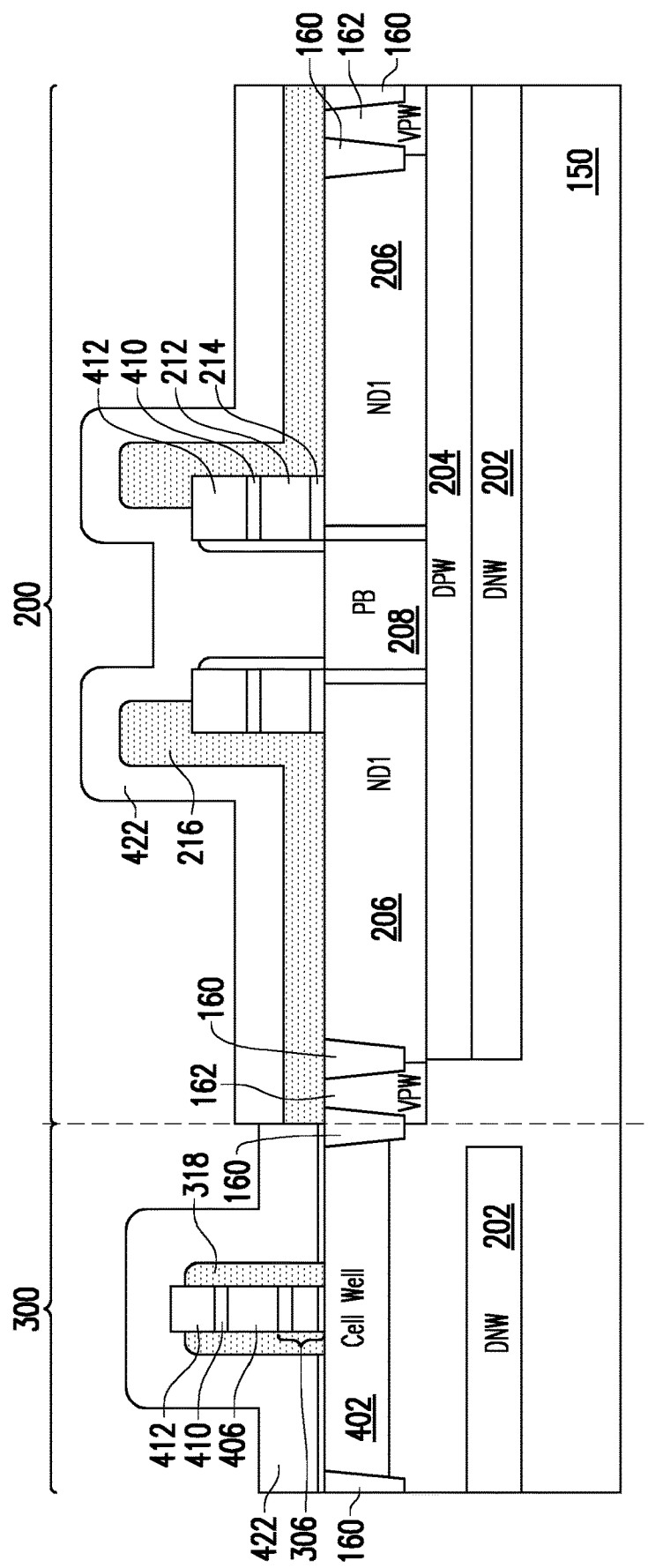

In FIG. 9P, a polysilicon layer 422 in an example is also globally formed over the substrate 150 in the cell region 300 and the HV region 200, in which a portion of the polysilicon layer 422 also fills into the gap between the two gate structures in the HV region 200. In the cell region 300, the polysilicon layer 422 with the gate insulating layer such as gate oxide layer is formed on the substrate 150.

Figure 9Q:
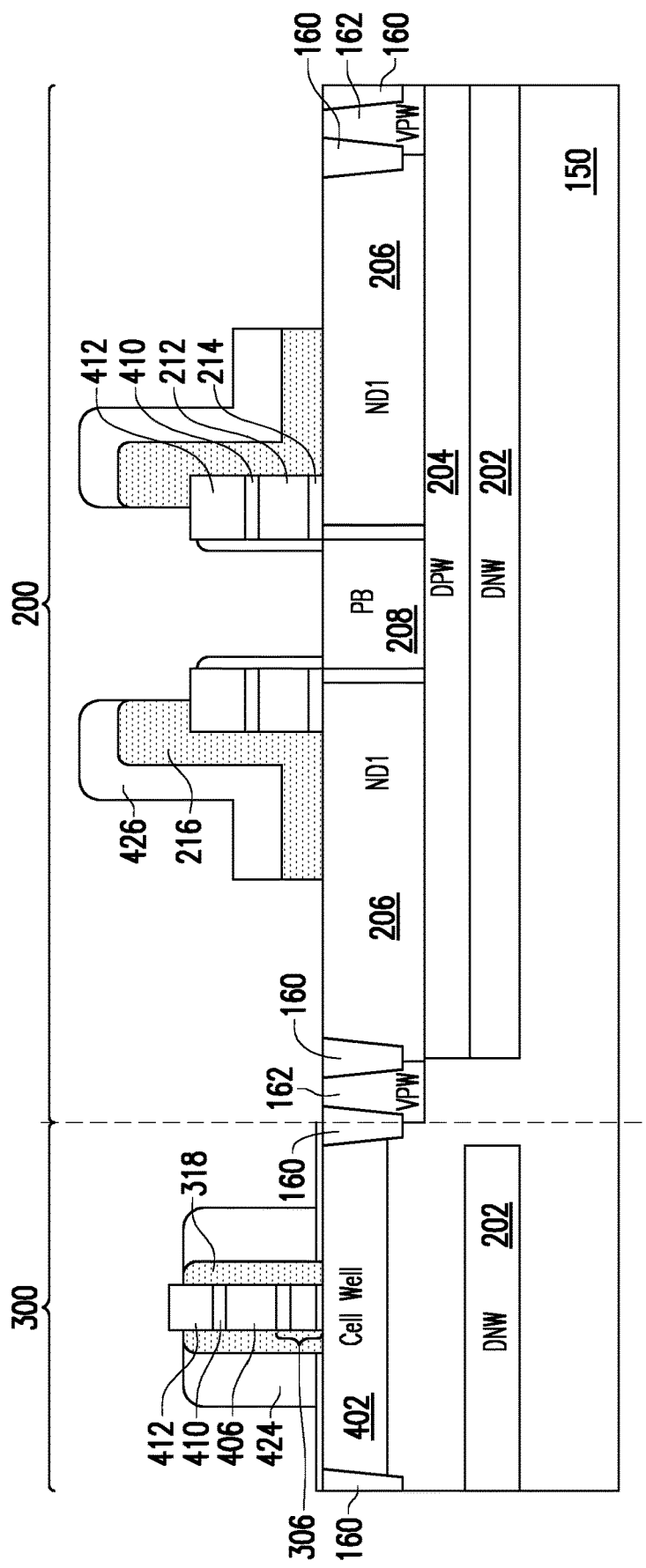

In FIG. 9Q, the polysilicon layer 422 with the dielectric layer 216 in the HV region 200 is patterned to have the gate plate layer 426 with the dielectric layer 216 by the ⊥-like structure. In the cell region 300, the polysilicon layer 422 is patterned to have the selection gate layer 424 on the spacer 318 and on the gate insulating layer, which is the remaining layer from the ONO layer as an example.

Figure 9R:
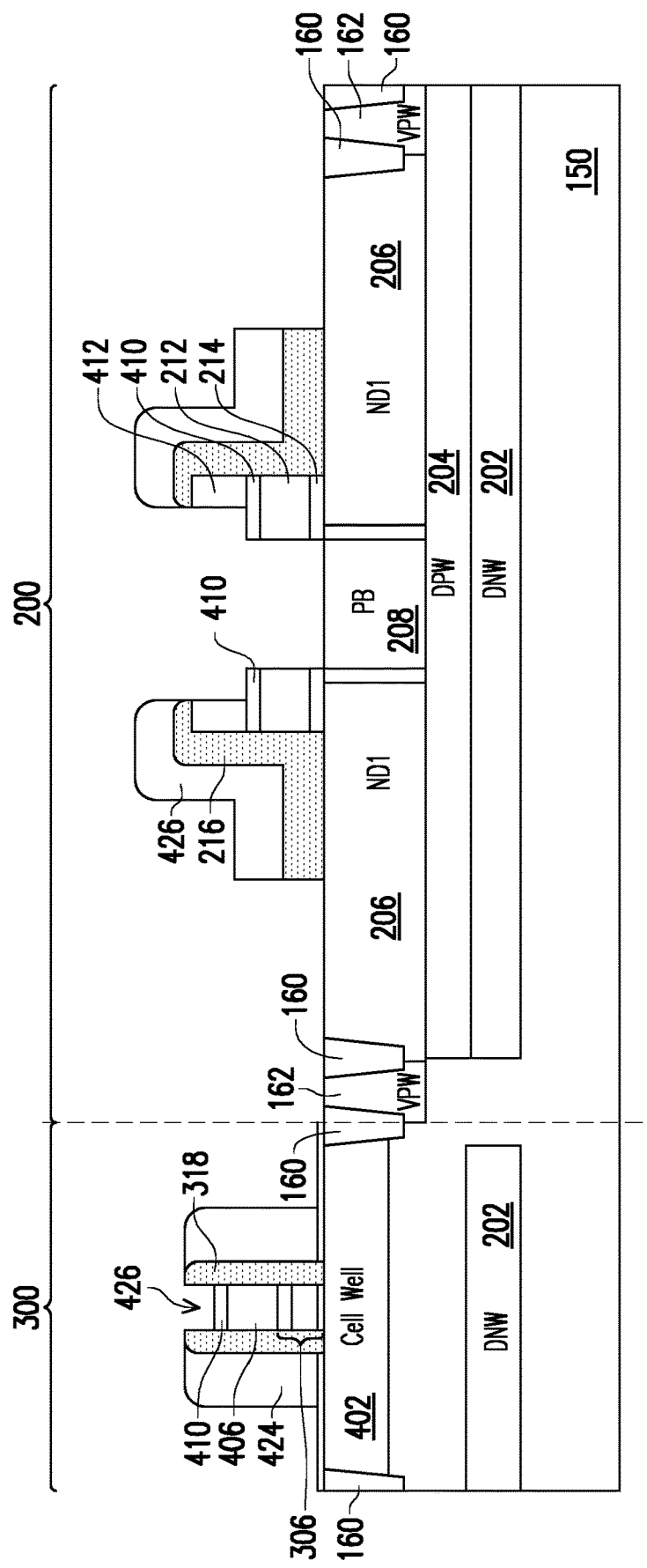

In FIG. 9R, the exposed portion of the nitride mask layer 412 is removed in the HV region 300 and in the HV region 200, in which the residual spacers are also further removed, as an example. The nitride mask layer 412 as a part of the gate structure in an example is serving as a partial mask on the top of the gate layer 212, in which the buffer oxide layer 410 still remains on the gate layer 212. In the cell region 300, a space 426 between the dielectric layers 318 is formed due to the nitride mask layer 412 being removed.

Figure 9S:
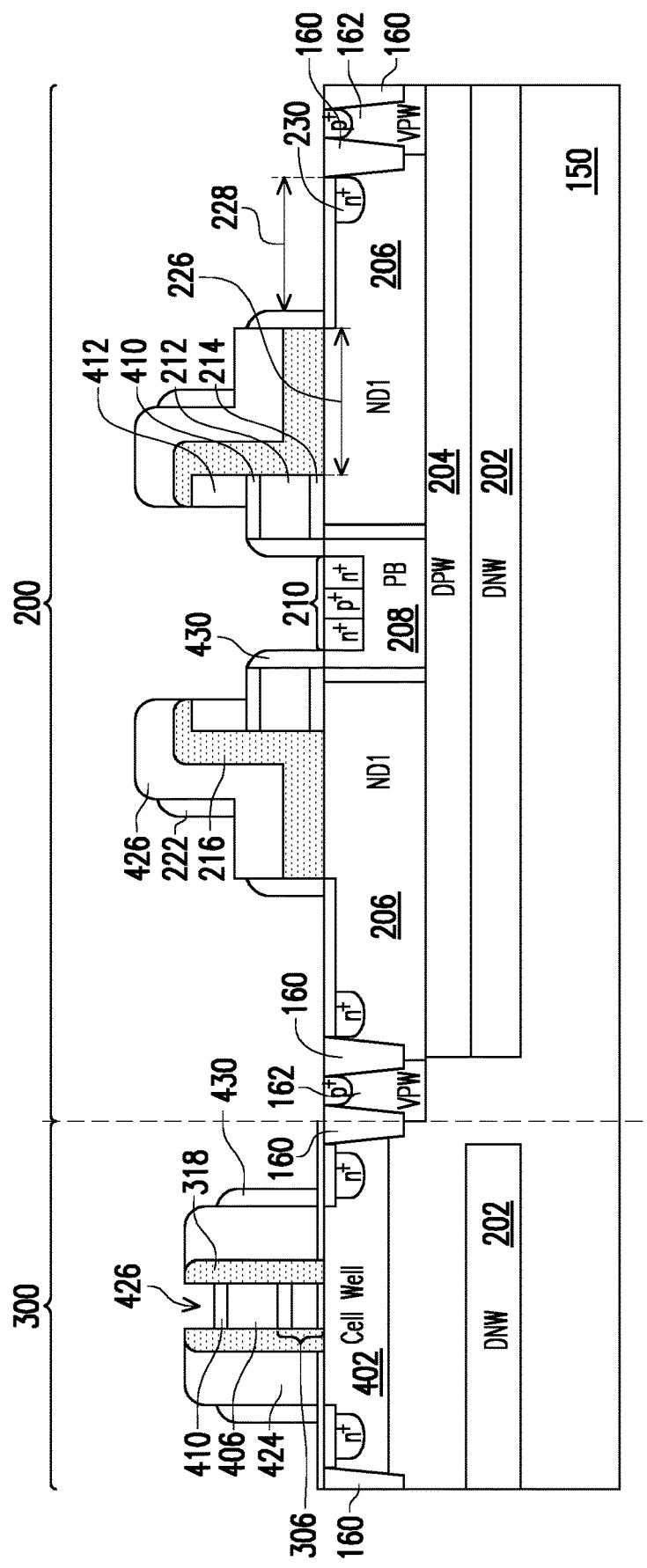
Figure 9T:
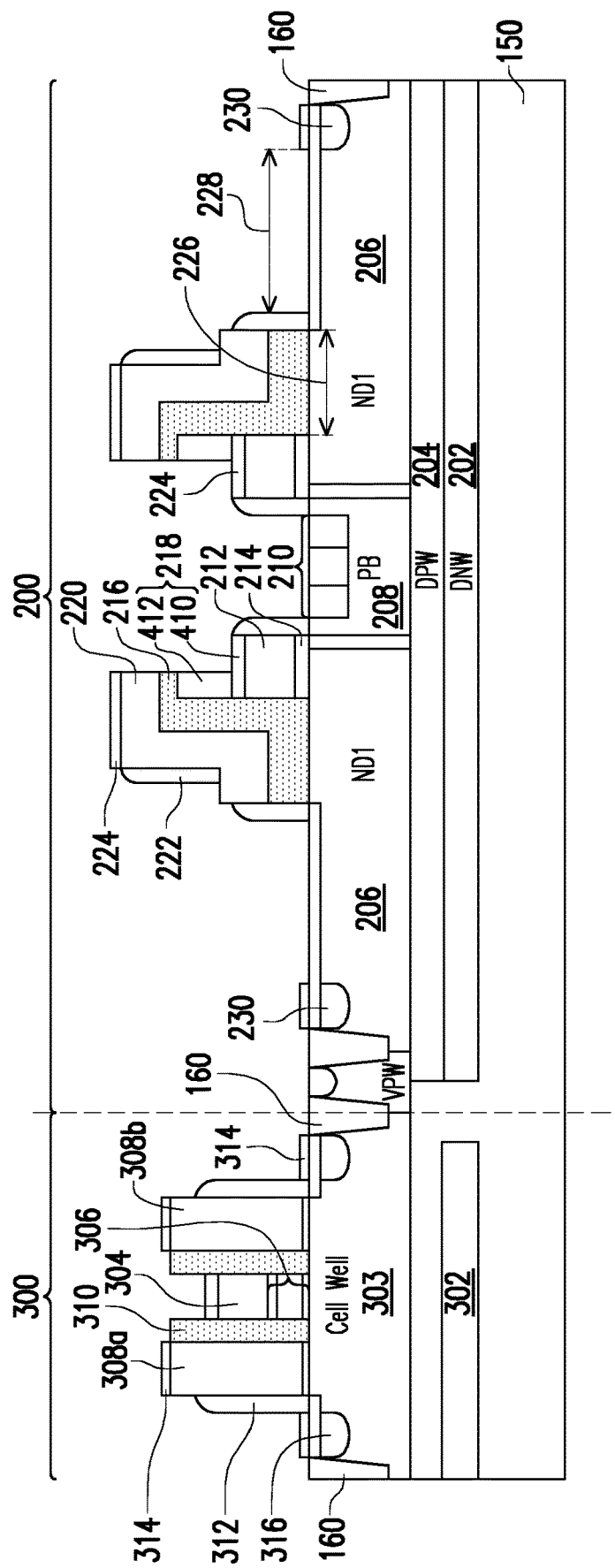

In FIG. 9S, additional spacers 430 in the HV region 200 and the cell region 300 are formed on various sidewalls of structures, such as the inner sidewall of the gate layer 212 with the gate insulating layer 214 in the HV region 200 while the buffer oxide layer 410 still remains. In cell region 300, the spacer 430 is also additionally formed at outer sidewall of the selection gate layer 424. Then, the source region 210 in the substrate 150 by the NPN structure is formed within the P-type doped region 208, in which the N-type doped regions (n+) are for the source regions for the two transistors in the HV region 200. The P-type doped region (p+) separates the two N-type doped regions (n+). In addition, multiples spacers are additionally formed on the outer sidewall of the structure, in an embodiment. The source/drain regions (n+) in cell region 300 are formed. In HV region 200, the drain regions 230 are also formed. In addition, the P-type doped region (p+) in the doped region 162 may also formed.

As noted, the invention is not just limited to the embodiment. The source region and the drains region even further with the lightly doped region may be included according to the actual design. As further noted, in the embodiment takes the LDMOS device in the HV region as an example for description. However, the LDPMOS device may be taken, in which the conductive types of n-type and p-type for those various doped regions are changed accordingly. In this example, the source region 210 in the substrate 150 is the PNP structure.

In FIG. 9T, the silicide layer 314 in an embodiment may be formed on the selection gate layer 308a and 308b in the cell region 300. The selection gate layer 308a and 308b are from the selection gate layer 424 in FIG. 9S. The silicide 314 may also be formed on the doped region 316. The invention does not limit the way to form the silicide layer. In HV region 200, the silicide 224 may also be formed on any exposed surface of silicon material for the gate layer and the source/drain regions, generally, but the invention is not just limited to.

In the structure, the size of the bottom horizontal portion 226 of the dielectric layer 216 may be well controlled, and then the size of the region 228 between the gate structure and the drain region 230 is well controlled. As a result, the breakdown voltage may be maintained sufficiently high.

As to the dielectric layer in L-like structure, the fabrication process may be further modified. FIG. 10A to FIG. 10E are drawings at cross-section view, schematically illustrating a fabrication flow of the method for fabrication semiconductor device, according to an embodiment of the invention.

Figure 10A:
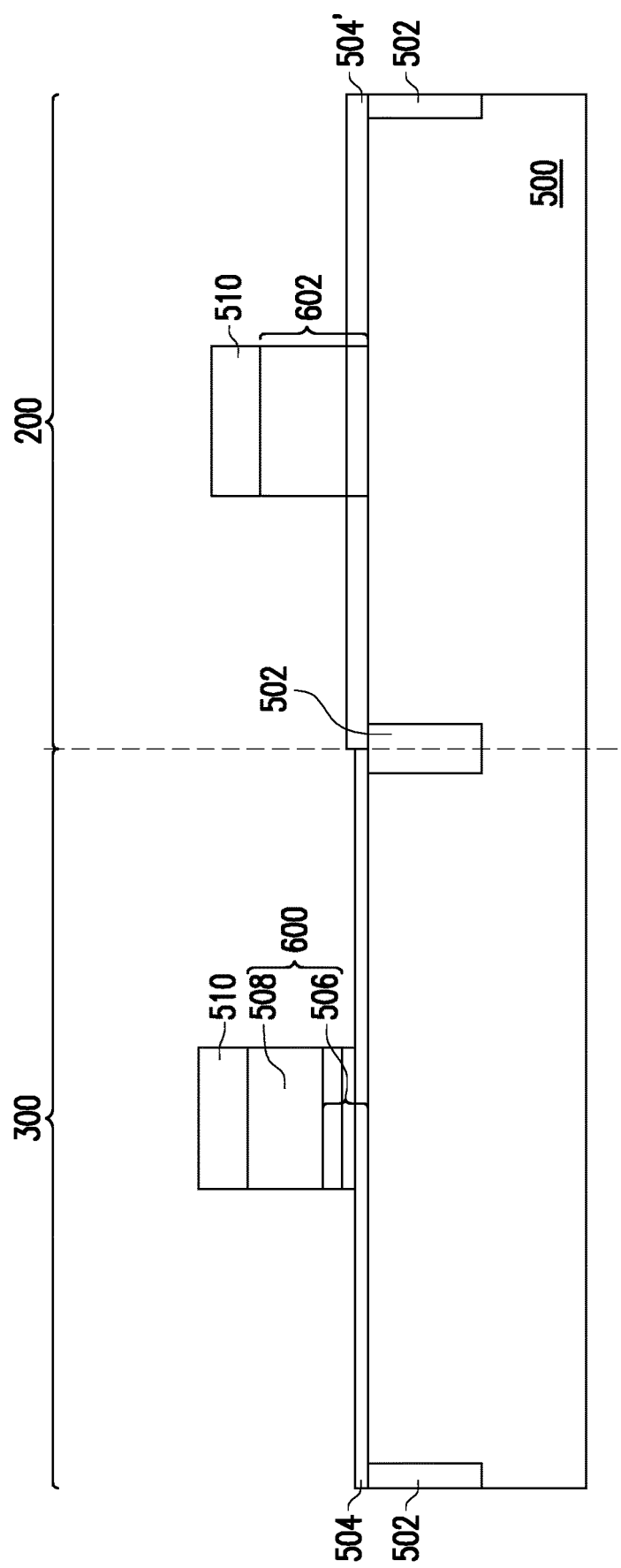
FIG. 10A to FIG. 10E are drawings at cross-section view, schematically illustrating a fabrication flow of the method for fabrication semiconductor device, according to an embodiment of the invention.

Referring to FIG. 10A, the substrate 500 is configured to have a cell region 300 and a HV region 200. STI structures 502 are formed in the substrate 500 to isolate the active regions. An oxide layer 504 in an example is formed on the substrate 500 in the cell region 300 and also an oxide layer 504' is formed on the substrate 500 in the HV region 200. In the cell region 300, a memory gate structure 600 is formed on the oxide layer 504. The memory gate structure 600 includes a charge storage layer 506 and a memory gate layer 508. The charge storage layer 506 in an embodiment is an ONO layer, in which a portion of the oxide layer 504 provides as a bottom oxide of the ONO layer. The mask layer 510 may also be formed on the memory gate structure 600.

In the HV region 200, a portion of the oxide layer 504' provides as a gate insulating layer to form a gate structure 602 for HV transistor. Likewise, the mask layer 510 may also be formed on the gate structure 602. The oxide layer 504' is relative thick, so as to form the HV transistor at the end.

Here, the various doped structures in the substrate are not specifically described and may be referring to the foregoing descriptions.

Figure 10B:
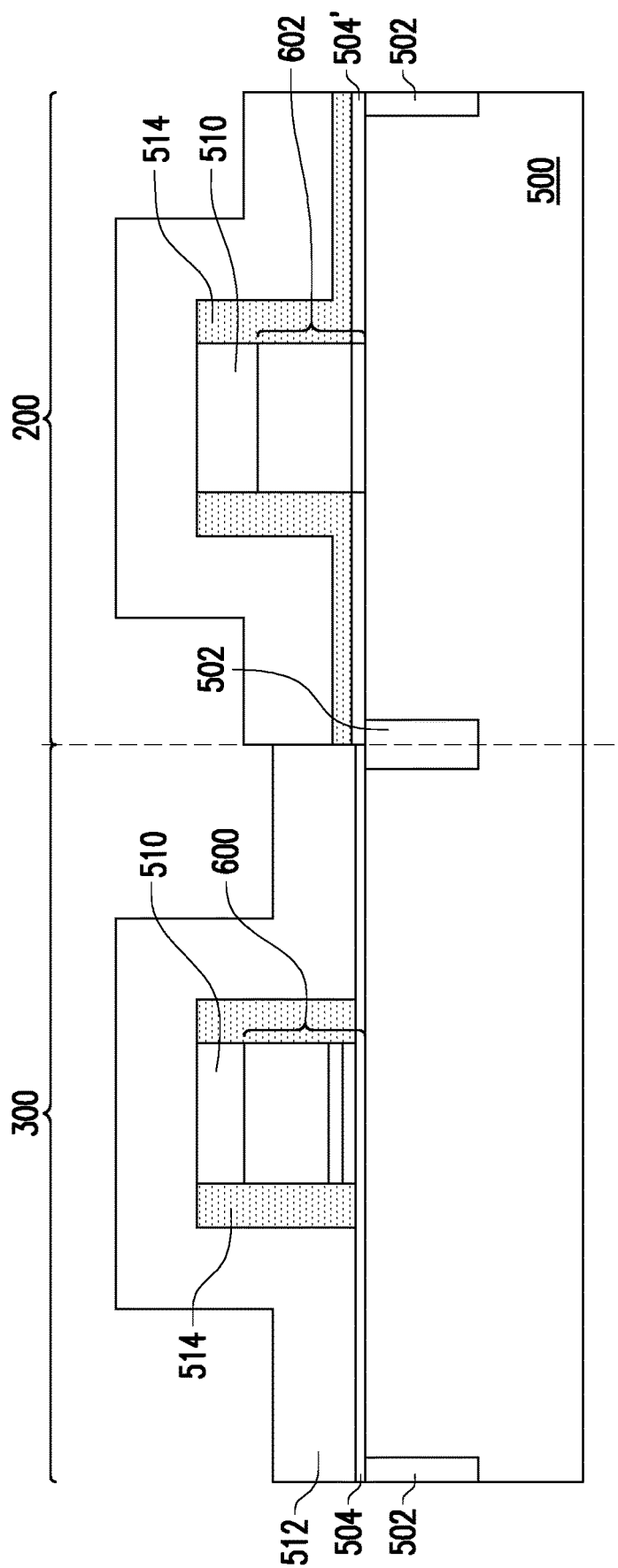

In FIG. 10B, a dielectric layer 514 is formed on the sidewall of the memory gate structure 600 with the mask layer 510 in the cell region 300. In the HV region 200, the dielectric layer 514 is also formed on the sidewall of the gate structure 602 with the mask layer 510. As noted, the dielectric layer 514 in the HV region 200 also includes a bottom horizontal portion on the oxide layer 504'. A preliminary polysilicon layer 512 in an embodiment is globally and conformally formed over the substrate 500 in the cell region 300 and the HV region 200.

As noted, in an embodiment, the dielectric layer 514 in the cell region 300 and in the HV region 200 may be originated from the same preliminary dielectric layer. However, the dielectric layer 514 in the cell region 300 and in the HV region 200 may be not necessarily originated from the same preliminary dielectric layer. The invention is not limited to.

Figure 10C:
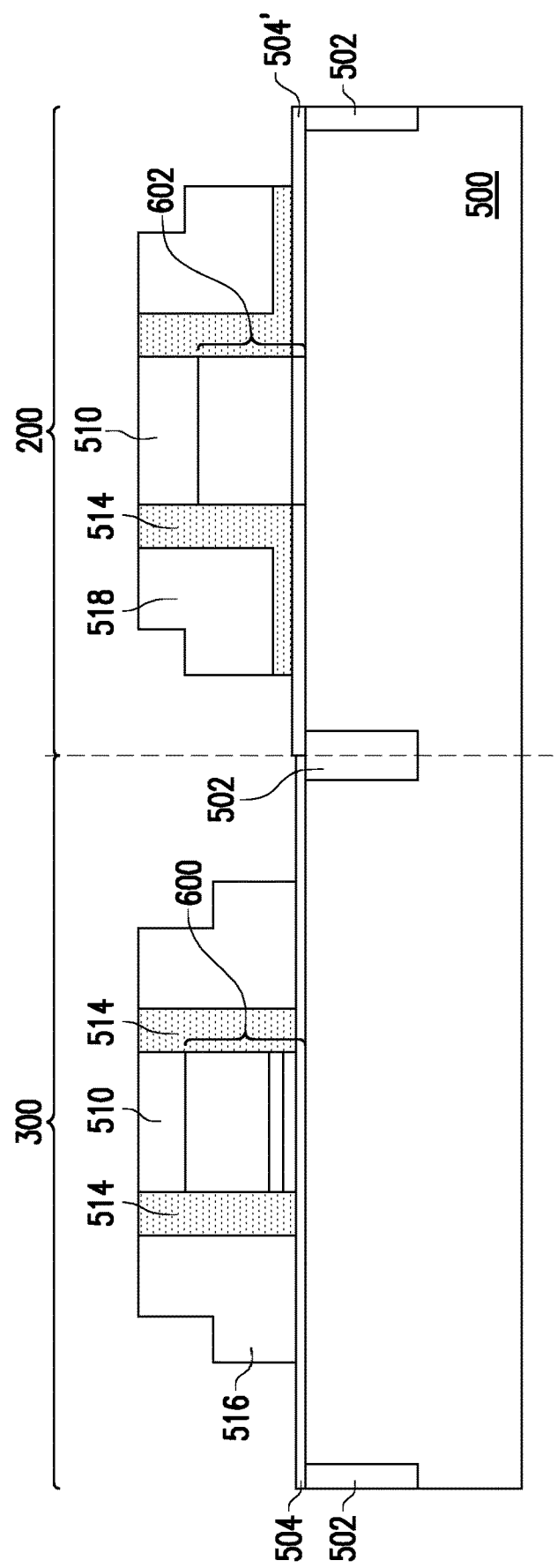

In FIG. 10C, the polysilicon layer 512 in the cell region 300 is patterned into a selection gate layer 516 with a portion of the oxide layer 504 serving as the gate insulating layer. In the HV region 200, the polysilicon layer 512, the dielectric layer 514 and the oxide layer 504' are patterned to form the dielectric layer 514 with the oxide layer 504' as integrated together. The dielectric layer 514 is the L-like structure. The polysilicon layer 518 on the dielectric layer 514 may also be the L-like structure as well. The polysilicon layer 512 in FIG. 10B after patterning becomes the gate plate layer 518, actually. The gate plate layer 518 is insulated from the gate structure 602 by at least the dielectric layer 514 in L-like structure.

Figure 10D:
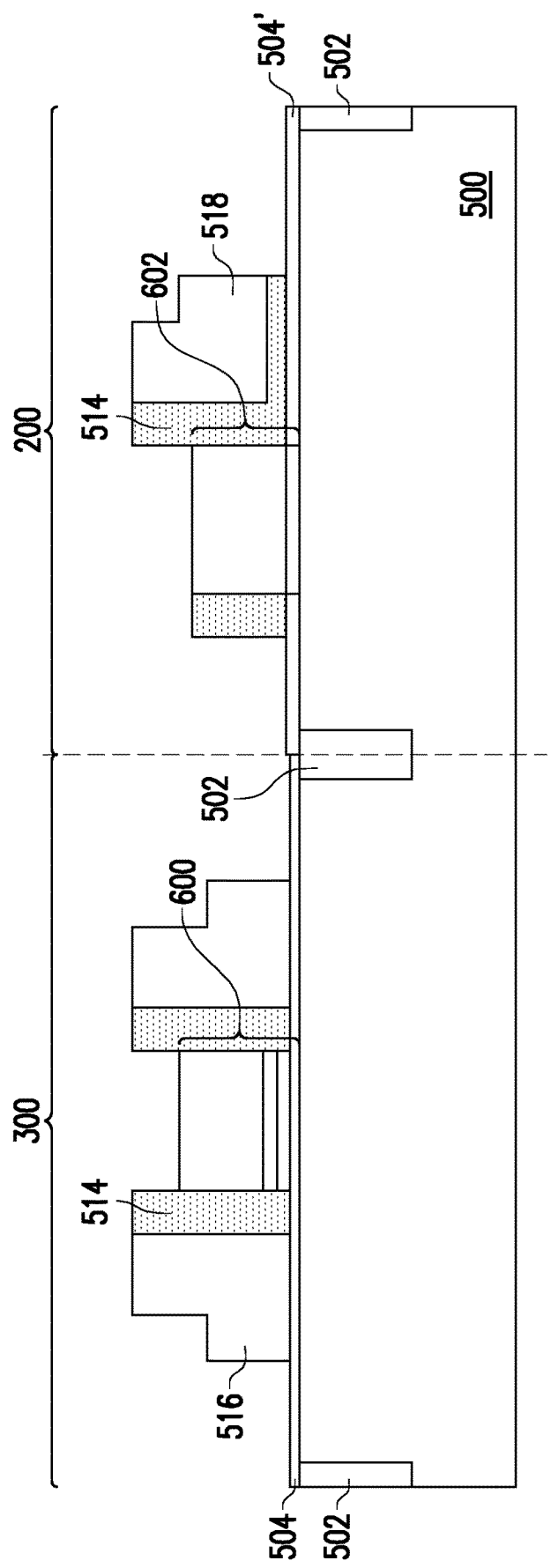

In FIG. 10D, the mask layer 510 in the cell region 300 and the HV region 200 is removed to expose the memory gate structure 600 in the cell region 300 and the gate structure 602 in the HV region 200. As noted, in an embodiment, one HV transistor in the HV region 200 is taken as an example, so that one gate plate layer 518 is left in the example.

Figure 10E:
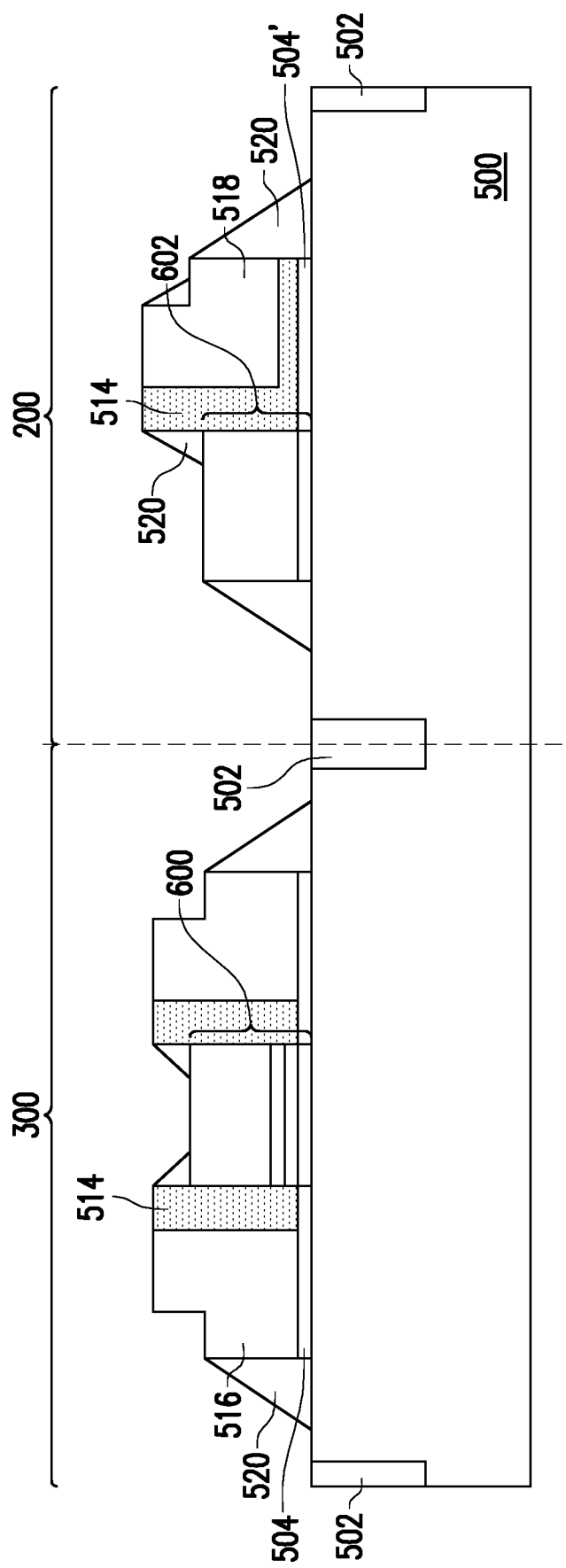

In FIG. 10E, various spacer 520 may also be formed on the sidewalls of the memory gate structure 600 and the gate structure 602. In addition, the silicide layer may be further subsequently formed on the exposed silicon surface of the memory gate structure 600 and the gate structure 602, but the invention is not limited to the subsequent process.

The invention has formed the dielectric layer 514 on the sidewall of the gate structure 602 in the HV region 200, in which a usually spacer on the sidewall of the gate structure 602 is not involved in the invention. The length of the horizontal portion of the ⌐-like structure or an L-like structure may be well controlled so that the breakdown voltage may be maintained in well control.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A structure of semiconductor device, comprising:
    a substrate, configured to have a cell region and a high-voltage region;
    a memory cell, on the substrate within the cell region, the memory cell including:
        a memory gate structure on the substrate;
        a selection gate structure on the substrate; and
        a first spacer, sandwiched between or respectively on sidewalls of the memory cell structure and the selection gate structure; and
    a first high-voltage transistor, on the substrate within the high-voltage region, a first composite gate structure of the first high-voltage transistor including:
        a first gate structure on the substrate;
        an insulating layer with a predetermined thickness on the substrate in ⌐-like structure or an L-like structure at cross-section; and a second gate structure on the insulating layer along the ⌐-like structure or the L-like structure, wherein the insulating layer and the first spacer are originated from a same preliminary dielectric layer, wherein the selection gate structure and the second gate structure are originated from a same preliminary conductive layer.

2. The structure of semiconductor device in claim 1, further comprising a second spacer on outer sidewall of the selection gate structure or on the first spacer, on a sidewall of the insulating layer with the second gate structure and on a sidewall of the first gate structure.

3. The structure of semiconductor device in claim 1, wherein a length of a bottom horizontal portion of the ⌐-like structure or the L-like structure is set by a predetermined value.

4. The structure of semiconductor device in claim 1, wherein the insulating layer of the high-voltage transistor is directly sandwiched between the first gate structure and the second gate structure.

5. The structure of semiconductor device in claim 1, wherein the insulating layer of the high-voltage transistor is the ⌐-like structure, and a top horizontal portion of the ⌐-like structure is overlapping with the first gate structure.

6. The structure of semiconductor device in claim 5, wherein the first gate structure includes a partial mask at top of the first gate structure and under the top horizontal portion of the insulating layer.

7. The structure of semiconductor device in claim 1, wherein the insulating layer of the high-voltage transistor is the L-like structure, and a vertical portion of the L-like structure is directly sandwiched between the first gate structure and the second gate structure.

8. The structure of semiconductor device in claim 1, wherein the memory gate structure comprises an oxide/nitride/oxide (ONO) layer and a conductive gate layer, sacked on the substrate, the selection gate is adjacent to the memory gate structure.

9. The structure of semiconductor device in claim 1, further comprising a second high-voltage transistor having a second composite gate structure being symmetrical to the first composite gate structure, wherein a region of the substrate between the first composite gate structure and the second composite gate structure comprises doped consecutive regions of N-type, P-type and N-type (NPN) or P-type, N-type and P-type (PNP).

10. The structure of semiconductor device in claim 9, further comprising:
a first-type doped region under each of the first composite gate structure and the second composite gate structure; and
a second-type doped region between the two first-type doped regions under the doped region of NPN or PNP.

11. A structure of semiconductor device, comprising:
a substrate, configured to have a cell region and a high-voltage region;
a memory cell, on the substrate within the cell region, the memory cell including:
a memory gate structure on the substrate;
a selection gate structure on the substrate; and
a first spacer, sandwiched between or respectively on sidewalls of the memory cell structure and the selection gate structure; and
a first high-voltage transistor, on the substrate within the high-voltage region, a first composite gate structure of the first high-voltage transistor including:
a first gate structure on the substrate;

an insulating layer with a predetermined thickness on the substrate in a ⌐-like structure or an L-like structure at cross-section; and
a second gate structure on the insulating layer along the ⌐-like structure or the L-like structure,
wherein the selection gate structure and the second gate structure are originated from a same preliminary conductive layer.

12. A method for fabricating semiconductor device, comprising:
providing a substrate, configured to have a cell region and a high-voltage region;
forming a memory cell on the substrate within the cell region, the memory cell including:
a memory gate structure on the substrate;
a selection gate structure on the substrate; and
a first spacer, sandwiched between or respectively on sidewalls of the memory cell structure and the selection gate structure; and
forming a first high-voltage transistor, on the substrate within the high-voltage region, wherein a first composite gate structure of the first high-voltage transistor as formed includes:
a first gate structure on the substrate;
an insulating layer with a predetermined thickness on the substrate in ⌐-like structure or an L-like structure at cross-section,
a second gate structure on the insulating layer along the ⌐-like structure or the L-like structure;
wherein the insulating layer and the first spacer are formed from a same preliminary dielectric layer or from different preliminary dielectric layers,
wherein the selection gate structure and the second gate structure are originated from a same preliminary conductive layer.

13. The method for fabricating semiconductor device in claim 12, further comprising forming a second spacer on outer sidewall of the selection gate structure or on the first spacer, on a sidewall of the insulating layer with the second gate structure and on a sidewall of the first gate structure.

14. The method for fabricating semiconductor device in claim 12, wherein a length of a bottom horizontal portion of the ⌐-like structure or the L-like structure is set to a predetermined value by a patterning process.

15. The method for fabricating semiconductor device in claim 12, wherein the insulating layer of the high-voltage transistor as formed is directly sandwiched between the first gate structure and the second gate structure.

16. The method for fabricating semiconductor device in claim 12, wherein the insulating layer of the high-voltage transistor as formed is the ⌐-like structure, and a top horizontal portion of the ⌐-like structure is overlapping with the first gate structure.

17. The method for fabricating semiconductor device in claim 16, wherein the first gate structure as formed includes a partial mask at top of the first gate structure and under the top horizontal portion of the insulating layer.

18. The method for fabricating semiconductor device in claim 12, wherein the insulating layer of the high-voltage transistor as formed is the L-like structure, and a vertical portion of the L-like structure is directly sandwiched between the first gate structure and the second gate structure.

19. The method for fabricating semiconductor device in claim 12, wherein the memory gate structure as formed comprises an oxide/nitride/oxide (ONO) layer and a conductive gate layer, sacked on the substrate, the selection gate is adjacent to the memory gate structure.

20. The method for fabricating semiconductor device in claim 12, further comprising:
- simultaneously forming a second high-voltage transistor having a second composite gate structure being symmetrical to the first composite gate structure; and
- forming doped consecutive regions of N-type, P-type and N-type (NPN) or P-type, N-type and P-type (PNP) at a region of the substrate between the first composite gate structure and the second composite gate structure.

21. The method for fabricating semiconductor device in claim 20, further comprising:
- forming a first-type doped region under each of the first composite gate structure and the second composite gate structure; and
- forming a second-type doped region between the two first-type doped regions under the doped region of NPN or PNP.

* * * * *